(12) United States Patent
Fujita et al.

(10) Patent No.: US 12,719,479 B2
(45) Date of Patent: Aug. 25, 2026

(54) SEMICONDUCTOR DEVICE

(71) Applicant: SEMICONDUCTOR ENERGY LABORATORY CO., LTD., Atsugi (JP)

(72) Inventors: Masashi Fujita, Tokyo (JP); Yutaka Shionoiri, Isehara (JP); Kiyoshi Kato, Atsugi (JP); Hidetomo Kobayashi, Isehara (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 45 days.

(21) Appl. No.: 19/018,549

(22) Filed: Jan. 13, 2025

(65) Prior Publication Data

US 2025/0150083 A1 May 8, 2025

Related U.S. Application Data

(63) Continuation of application No. 18/240,389, filed on Aug. 31, 2023, now Pat. No. 12,283,954, which is a (Continued)

(30) Foreign Application Priority Data

May 20, 2011 (JP) ................................ 2011-113057

(51) Int. Cl.
*H03K 19/17728* (2020.01)
*H03K 19/173* (2006.01)
(Continued)

(52) U.S. Cl.
CPC ... *H03K 19/17728* (2013.01); *H03K 19/1737* (2013.01); *H03K 19/17758* (2020.01); *H03K 19/17772* (2013.01)

(58) Field of Classification Search
None
See application file for complete search history.

(56) References Cited

U.S. PATENT DOCUMENTS 3,383,570 A * 5/1968 Luscher ................ G04C 3/065 257/300
4,541,067 A 9/1985 Whitaker
(Continued)

FOREIGN PATENT DOCUMENTS

CN 001322672 C 6/2007
CN 102024410 A 4/2011
(Continued)

OTHER PUBLICATIONS

Taiwanese Office Action (Application No. 101117373) Dated Jan. 22, 2016.

(Continued)

*Primary Examiner* — Jany Richardson
(74) *Attorney, Agent, or Firm* — Fish & Richardson P.C.

(57) ABSTRACT

An object is to provide a semiconductor device that can maintain the connection relation between logic circuit units or the circuit configuration of each of the logic circuit units even after supply of power supply voltage is stopped. Another object is to provide a semiconductor device in which the connection relation between logic circuit units or the circuit configuration of each of the logic circuit units can be changed at high speed. In a reconfigurable circuit, an oxide semiconductor is used for a semiconductor element that stores data on the circuit configuration, connection relation, or the like. Specifically, the oxide semiconductor is used for a channel formation region of the semiconductor element.

12 Claims, 27 Drawing Sheets

Related U.S. Application Data continuation of application No. 17/150,859, filed on Jan. 15, 2021, now Pat. No. 11,750,194, which is a continuation of application No. 16/705,326, filed on Dec. 6, 2019, now Pat. No. 10,897,258, which is a continuation of application No. 15/610,705, filed on Jun. 1, 2017, now Pat. No. 10,505,547, which is a continuation of application No. 13/469,143, filed on May 11, 2012, now Pat. No. 9,762,246.

(51) Int. Cl.
*H03K 19/17758* (2020.01)
*H03K 19/17772* (2020.01)

(56) References Cited

U.S. PATENT DOCUMENTS

| | | | |
|---|---|---|---|
| 4,642,487 | A | 2/1987 | Carter |
| 5,329,178 | A | 7/1994 | Burton |
| 5,526,278 | A | 6/1996 | Powell |
| 5,847,577 | A | 12/1998 | Trimberger |
| 6,373,291 | B1 | 4/2002 | Hamada et al. |
| 6,515,511 | B2 | 2/2003 | Sugibayashi et al. |
| 6,515,892 | B1 | 2/2003 | Itoh et al. |
| 6,762,951 | B2 | 7/2004 | Itoh et al. |
| 6,831,481 | B1 | 12/2004 | Nguyen et al. |
| 6,845,032 | B2 | 1/2005 | Toyoda et al. |
| 6,847,228 | B1 | 1/2005 | Crotty et al. |
| 6,876,569 | B2 | 4/2005 | Itoh et al. |
| 6,940,307 | B1 | 9/2005 | Liu et al. |
| 7,023,721 | B2 | 4/2006 | Itoh et al. |
| 7,064,574 | B1 | 6/2006 | Voogel et al. |
| 7,076,595 | B1 | 7/2006 | Dao et al. |
| 7,129,749 | B1 | 10/2006 | Fenstermaker et al. |
| 7,266,632 | B2 | 9/2007 | Dao et al. |
| 7,336,097 | B2 | 2/2008 | Madurawe |
| 7,406,557 | B2 | 7/2008 | Dao et al. |
| 7,764,081 | B1 | 7/2010 | Tuan et al. |
| 7,800,400 | B2 | 9/2010 | Rahim et al. |
| 7,812,635 | B1 | 10/2010 | Hutton |
| 7,863,930 | B2 | 1/2011 | Nishioka |
| 8,030,962 | B2 | 10/2011 | Rahim et al. |
| 8,060,797 | B2 | 11/2011 | Hida et al. |
| 8,072,238 | B1 | 12/2011 | Hutton |
| 8,193,045 | B2 | 6/2012 | Omura et al. |
| 8,219,861 | B2 | 7/2012 | Hida et al. |
| 8,471,620 | B2 | 6/2013 | Koyama et al. |
| 8,583,972 | B2 | 11/2013 | Hida et al. |
| 8,624,656 | B2 | 1/2014 | Koyama et al. |
| 8,643,162 | B2 | 2/2014 | Madurawe |
| 8,793,555 | B2 | 7/2014 | Hida et al. |
| 8,872,171 | B2 | 10/2014 | Yamazaki et al. |
| 8,872,572 | B2 | 10/2014 | Koyama et al. |
| 8,896,042 | B2 | 11/2014 | Yamazaki et al. |
| 9,037,947 | B2 | 5/2015 | Hida et al. |
| 9,105,511 | B2 | 8/2015 | Yamazaki et al. |
| 9,171,938 | B2 | 10/2015 | Yamazaki et al. |
| 9,368,519 | B2 | 6/2016 | Koyama et al. |
| 9,373,640 | B2 | 6/2016 | Yamazaki et al. |
| 9,530,872 | B2 | 12/2016 | Yamazaki et al. |
| 9,577,642 | B2 | 2/2017 | Or-Bach et al. |
| 9,627,198 | B2 | 4/2017 | Yamazaki et al. |
| 9,685,447 | B2 | 6/2017 | Yamazaki et al. |
| 2002/0079921 | A1 | 6/2002 | Kaviani et al. |
| 2002/0186044 | A1 | 12/2002 | Agrawal et al. |
| 2005/0162933 | A1 | 7/2005 | Madurawe |
| 2006/0119387 | A1 | 6/2006 | Okamoto |
| 2007/0085847 | A1* | 4/2007 | Shishido ............. G09G 3/3225 345/39 |
| 2008/0068041 | A1 | 3/2008 | Madurawe |
| 2008/0169836 | A1 | 7/2008 | Rahim et al. |
| 2008/0218203 | A1 | 9/2008 | Arriens et al. |
| 2008/0290898 | A1 | 11/2008 | Hutton |
| 2009/0090914 | A1 | 4/2009 | Yano et al. |
| 2009/0206332 | A1 | 8/2009 | Son et al. |
| 2009/0243652 | A1 | 10/2009 | Dorairaj et al. |
| 2010/0177560 | A1 | 7/2010 | McElheny et al. |
| 2011/0049592 | A1 | 3/2011 | Yoon et al. |
| 2011/0101334 | A1 | 5/2011 | Yamazaki et al. |
| 2011/0101339 | A1 | 5/2011 | Yamazaki et al. |
| 2011/0101351 | A1 | 5/2011 | Yamazaki |
| 2011/0187410 | A1 | 8/2011 | Kato et al. |
| 2011/0191569 | A1 | 8/2011 | Ishikawa et al. |
| 2011/0199117 | A1 | 8/2011 | Hutchings et al. |
| 2012/0195122 | A1* | 8/2012 | Ohmaru ................ H10D 86/60 365/185.08 |
| 2012/0319728 | A1 | 12/2012 | Madurawe |
| 2015/0048363 | A1 | 2/2015 | Yamazaki et al. |
| 2016/0293129 | A1 | 10/2016 | Koyama et al. |
| 2017/0229086 | A1 | 8/2017 | Koyama et al. |
| 2017/0271338 | A1 | 9/2017 | Yamazaki et al. |

FOREIGN PATENT DOCUMENTS

| | | | |
|---|---|---|---|
| EP | 0544368 | A | 6/1993 |
| EP | 2256814 | A | 12/2010 |
| JP | 02-291720 | A | 12/1990 |
| JP | 08-095818 | A | 4/1996 |
| JP | 09-046216 | A | 2/1997 |
| JP | 11-317659 | A | 11/1999 |
| JP | 2001-230326 | A | 8/2001 |
| JP | 2000/070682 | | 12/2002 |
| JP | 2004-039208 | A | 2/2004 |
| JP | 2004-529581 | | 9/2004 |
| JP | 2004/059838 | | 5/2006 |
| JP | 2008-035153 | A | 2/2008 |
| JP | 2008-176912 | A | 7/2008 |
| JP | 2008-283526 | A | 11/2008 |
| JP | 2009-010362 | A | 1/2009 |
| JP | 2010-045263 | A | 2/2010 |
| JP | 2011-009719 | A | 1/2011 |
| JP | 2011-087286 | A | 4/2011 |
| JP | 2011-091381 | A | 5/2011 |
| JP | 2011-100980 | A | 5/2011 |
| JP | 2011-119675 | A | 6/2011 |
| KR | 1993-0011221 | A | 6/1993 |
| KR | 0148405 | | 11/1998 |
| KR | 2001-0002996 | A | 1/2001 |
| TW | 200941488 | | 10/2009 |
| TW | 201020795 | | 6/2010 |
| WO | WO-2002/095598 | | 11/2002 |
| WO | WO-2004/059838 | | 7/2004 |
| WO | WO-2008/149873 | | 12/2008 |
| WO | WO-2009/063584 | | 5/2009 |
| WO | WO-2009/107268 | | 9/2009 |
| WO | WO-2011/037010 | | 3/2011 |
| WO | WO-2011/052488 | | 5/2011 |

OTHER PUBLICATIONS

Taiwanese Office Action (Application No. 105120976) Dated Jan. 23, 2017.

Taiwanese Office Action (Application No. 105120976) Dated Sep. 30, 2017.

Korean Office Action (Application No. 2012-0052413) Dated Jun. 20, 2018.

* cited by examiner

FIG. 8A c-axis direction

In

O O O O O O electric charge: 0

O O O O O O electric charge: 0 a-b plane

O O O O electric charge: 0

O O O O O O electric charge: +1

O O O O O O O O electric charge: −1

Loff
33 nm
Loff
656a
657
655
656b
658a
658b
652
652
653a
653c
654
653b
651

FIG. 27A $I_0$
$I_1$
$I_2$
$I_3$
AND
AND
AND
AND
OR
O
103
W
D
F
$S_0$
107
OS 109
C
W
D
F
$S_1$
107
OS 109
103
C

FIG. 27B

| Select | | Output |
| --- | --- | --- |
| $S_0$ | $S_1$ | O |
| 0 | 0 | $I_0$ |
| 0 | 1 | $I_1$ |
| 1 | 0 | $I_2$ |
| 1 | 1 | $I_3$ |

SEMICONDUCTOR DEVICE

CROSS-REFERENCE TO RELATED APPLICATIONS

This application is a continuation of U.S. application Ser. No. 18/240,389, filed Aug. 31, 2023, now allowed, which is a continuation of U.S. application Ser. No. 17/150,859, filed Jan. 15, 2021, now U.S. Pat. No. 11,750,194, which is a continuation of U.S. application Ser. No. 16/705,326, filed Dec. 6, 2019, now U.S. Pat. No. 10,897,258, which is a continuation of U.S. application Ser. No. 15/610,705, filed Jun. 1, 2017, now U.S. Pat. No. 10,505,547, which is a continuation of U.S. application Ser. No. 13/469,143, filed May 11, 2012, now U.S. Pat. No. 9,762,246, which claims the benefit of a foreign priority application filed in Japan as Serial No. 2011-113057 on May 20, 2011, all of which are incorporated by reference.

BACKGROUND OF THE INVENTION

1. Field of the Invention

The technical field relates to a semiconductor device, a method for driving a semiconductor device, and a method for manufacturing a semiconductor device. The semiconductor device is particularly a semiconductor integrated circuit including a semiconductor element such as a transistor.

2. Description of the Related Art

A programmable logic device (PLD) is one of semiconductor integrated circuits. A PLD is an integrated circuit having an internal configuration that can be determined and altered (is reconfigurable) after manufacture (see Patent Document 1).

A PLD has the following advantages, for example, over a conventional application specific integrated circuit (ASIC): the development period can be shortened and a PLD enables flexible response to a change in design specification. Accordingly, PLDs are used in various kinds of devices.

A PLD includes, for example, a plurality of logic circuit units and a wiring between the logic circuit units. A function of the PLD can be changed by changing the circuit configuration of each of the logic circuit units or by changing the connection relation between the logic circuit units.

Further, the PLD may include a storage circuit, in which case data on the circuit configuration of each of the logic circuit units and the data on the connection relation between the logic circuit units can be stored in the storage circuit.

As the logic circuit unit, an arithmetic logic unit (ALU) is used, for example. An ALU generally consists of an arithmetic operation unit including a combination of an adder, a subtractor, and the like; a logic operation unit including a combination of an AND circuit, an OR circuit, and the like; a shift operation unit including a shift circuit; and a selector circuit that selects these units to output their outputs, such as a multiplexer.

REFERENCE

Patent Document 1: Japanese Published Patent Application No. H11-317659

SUMMARY OF THE INVENTION

When SRAM or DRAM is used as the storage circuit, the connection relation between ALUs or the circuit configuration of each ALU, for example, can be changed at high speed. However, since SRAM and DRAM are volatile, stored data is lost when supply of power supply voltage is stopped.

When flash memory, which is nonvolatile, is used as the storage circuit, data can be maintained even after supply of power supply voltage is stopped. However, it is difficult to achieve high-speed operation and reduce power consumption because the drive voltage of flash memory is high.

In view of the above, an object of one embodiment of the present invention is to provide a semiconductor device that can maintain the connection relation between logic circuit units or the circuit configuration of each of the logic circuit units for a long time even after supply of power supply voltage is stopped.

Another object of one embodiment of the present invention is to provide a semiconductor device in which the connection relation between logic circuit units or the circuit configuration of each of the logic circuit units can be changed at high speed.

According to one embodiment of the present invention, a semiconductor device includes a storage circuit that stores data on a circuit configuration or the like, and includes a semiconductor element including an oxide semiconductor in the storage circuit. Specifically, the semiconductor device is a programmable logic device (PLD) and includes a logic circuit unit and a storage circuit. The circuit configuration of the logic circuit unit is maintained in accordance with data stored in the storage circuit.

The semiconductor device preferably includes a plurality of logic circuit units, in which case the storage circuit maintains the circuit configuration of each of the logic circuit units or the connection relation between the logic circuit units. The logic circuit unit can be an arithmetic logic unit (ALU) and may include an operation circuit, a selector circuit, or the like.

Note that in this specification, a PLD is also referred to as a reconfigurable circuit.

Note also that in this specification, a semiconductor device refers to a general object (e.g., an element and a device) that can operate by utilizing a semiconductor. A semiconductor device includes, in its category, a semiconductor element (e.g., a transistor and a diode), an electric device including the semiconductor element (e.g., an electronic circuit, a display device, and a light-emitting device), and an electronic device including the electric device.

According to another embodiment of the present invention, a semiconductor device includes a plurality of operation circuits, a selector circuit, and a storage circuit including a transistor and a capacitor. The storage circuit inputs data to the capacitor and the selector circuit through the transistor. The selector circuit selects at least one of operation results of the plurality of operation circuits in accordance with the data. An oxide semiconductor is used for a channel formation region of the transistor.

According to another embodiment of the present invention, a semiconductor device includes a plurality of logic circuit units and a connector unit. The connector unit includes a first transistor and a storage circuit. The storage circuit includes a second transistor and a capacitor. One of a source and a drain of the first transistor is electrically connected to one of the plurality of logic circuit units. The other of the source and the drain of the first transistor is electrically connected to another one of the plurality of logic circuit units. The storage circuit inputs data to the capacitor and a gate of the first transistor through the second transistor. The first transistor controls electrical connection between the one and the another one of the plurality of logic circuit units in accordance with the data. An oxide semiconductor is used for a channel formation region of the second transistor.

According to another embodiment of the present invention, a semiconductor device includes a plurality of logic circuit units each including a plurality of operation circuits and a selector circuit, a first storage circuit including a first transistor and a first capacitor, and a connector unit including a second transistor and a second storage circuit. The second storage circuit includes a third transistor and a second capacitor. The first storage circuit inputs first data to the first capacitor and the selector circuit through the first transistor. The selector circuit selects at least one of operation results of the plurality of operation circuits in accordance with the first data. One of a source and a drain of the second transistor is electrically connected to one of the plurality of logic circuit units. The other of the source and the drain of the second transistor is electrically connected to another one of the plurality of logic circuit units. The second storage circuit inputs second data to the second capacitor and a gate of the second transistor through the third transistor. The second transistor controls electrical connection between the one and the another one of the plurality of logic circuit units in accordance with the second data. An oxide semiconductor is used for channel formation regions of the first transistor and the third transistor.

According to one embodiment of the present invention, it is possible to provide a semiconductor device that can maintain data on the connection relation between logic circuit units or data on the circuit configuration of each of the logic circuit units for a long time even after supply of power supply voltage is stopped.

Moreover, according to one embodiment of the present invention, it is possible to provide a semiconductor device in which the connection relation between logic circuit units or the circuit configuration of each of the logic circuit units can be changed at high speed or with low power consumption.

BRIEF DESCRIPTION OF THE DRAWINGS

In the accompanying drawings:

FIGS. 4A and 4B each illustrate an example of a semiconductor device;

FIGS. 8A to 8E illustrate an example of a CAAC;

FIG. 12 shows the relation between field-effect mobility and gate voltage of a transistor;

FIGS. 27A and 27B illustrate an example of a semiconductor device.

DETAILED DESCRIPTION OF THE INVENTION

Figure 1A:
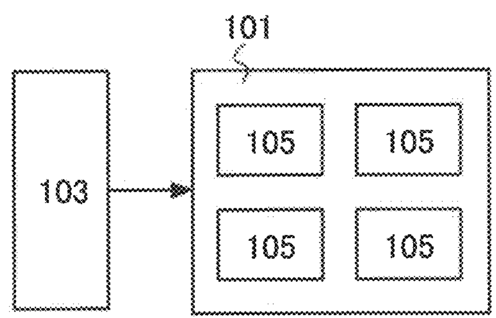
FIGS. 1A to 1C each illustrate an example of a semiconductor device.

Embodiments will be described below in detail with reference to the accompanying drawings. Note that the present invention is not limited to the following description and it is easily understood by those skilled in the art that the mode and details can be variously changed without departing from the spirit and scope of the present invention. Therefore, the present invention should not be construed as being limited to the description of the embodiments below.

Note that functions of a "source" and a "drain" are sometimes replaced with each other when a transistor of opposite polarity is employed or when the direction of a current flow is changed in a circuit operation, for example. Therefore, the terms "source" and "drain" can be replaced with each other in this specification.

The term "electrically connected" includes the case where components are connected through an "object having any electric function". There is no particular limitation on an object having any electric function as long as electric signals can be transmitted and received between components connected through the object. Examples of an object having any electric function are a switching element such as a transistor, a resistor, an inductor, a capacitor, and an element with a variety of functions as well as an electrode and a wiring.

Even when a circuit diagram illustrates independent components as if they are electrically connected to each other, there is actually a case where one conductive film has functions of a plurality of components, such as a case where part of a wiring also functions as an electrode. The "electrical connection" in this specification includes in its category such a case where one conductive film has functions of a plurality of components.

The term "over" or "below" does not necessarily mean that a component is placed "directly on" or "directly under" another component. For example, the expression "a gate electrode over a gate insulating layer" can mean the case where a component is placed between the gate insulating layer and the gate electrode.

The position, size, range, or the like of each component illustrated in drawings and the like is not accurately represented in some cases for easy understanding. Therefore, the disclosed invention is not necessarily limited to the position, size, range, or the like disclosed in the drawings and the like.

The ordinal number such as "first", "second", and "third" are used in order to avoid confusion among components.

Embodiment 1

In this embodiment, an example of a semiconductor device will be described.

FIG. 1A is an example of a block diagram of a semiconductor device.

The semiconductor device in FIG. 1A includes a logic circuit unit 101 and a storage circuit 103. The logic circuit unit 101 includes a plurality of logic circuits 105. In the semiconductor device, at least one of the plurality of logic circuits 105 is selected in accordance with data (also referred to as signal) stored in the storage circuit 103, and the circuit configuration of the logic circuit unit 101 is determined.

An example of the logic circuit unit 101 is an ALU. Examples of the plurality of logic circuits 105 are operation circuits such as an adder, a subtractor, a multiplier, an AND circuit, an OR circuit, a NOT circuit, an XOR circuit, and a shift circuit; and selector circuits such as a multiplexer. Alternatively, the logic circuit 105 may be one element such as one transistor. It can be said that the logic circuit 105 is a circuit including one or a plurality of elements functioning as switches (e.g., transistors).

The circuit configuration of the logic circuit unit 101 can be changed as appropriate in accordance with data stored in the storage circuit 103 so that the logic circuit unit 101 can be used as an adder or an AND circuit, for example.

Further, the circuit configuration of the logic circuit unit 101 can be maintained by holding data in the storage circuit 103. Note that the storage circuit 103 may be included in the logic circuit unit 101. A specific circuit configuration and a driving method of the semiconductor device will be described below.

(Circuit Configurations of Storage Circuit 103 and Logic Circuit 105)

Figure 1B:
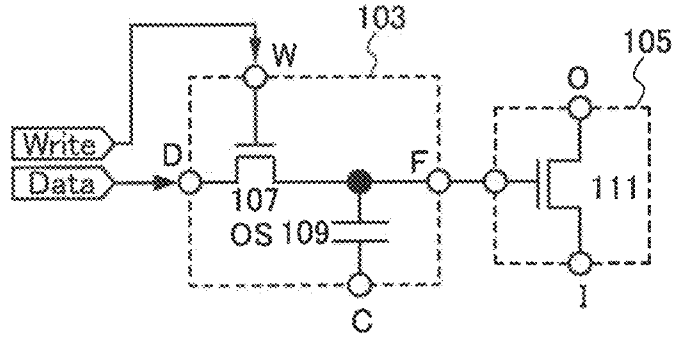

FIG. 1B illustrates examples of specific circuit configurations of the storage circuit 103 and the logic circuit 105.

The storage circuit 103 includes a transistor 107 and a capacitor 109. Note that a plurality of storage circuits 103 may be provided, and the number of storage circuits 103 can be determined in accordance with the configuration of the logic circuit unit 101. When a plurality of storage circuits 103 are provided, a group of the storage circuits may be simply referred to as a storage circuit or a storage circuit unit. In addition, the storage circuit 103 may include an element such as a resistor or a diode.

The transistor 107 is composed of an oxide semiconductor. Specifically, the oxide semiconductor is used for a channel formation region of the transistor 107. Note that in FIG. 1B, "OS" is written beside the transistor 107 in order to indicate that the oxide semiconductor is used in the transistor 107.

A gate of the transistor 107 is electrically connected to a terminal W. One of a source and a drain of the transistor 107 is electrically connected to a terminal D. The other of the source and the drain of the transistor 107 is electrically connected to a terminal F and one of a pair of electrodes of the capacitor 109. The other of the pair of electrodes of the capacitor 109 is electrically connected to a terminal C. Here, each of the terminals can be electrically connected to a wiring or an electrode. Note that a fixed potential (e.g., a low power supply potential) can be input to the terminal C.

The logic circuit 105 includes a transistor 111. Here, the case where the logic circuit 105 includes one transistor is described for simplicity; the logic circuit 105 may have another structure.

A gate of the transistor 111 is electrically connected to the terminal F of the storage circuit 103. That is, the gate of the transistor 111 is electrically connected to the other of the source and the drain of the transistor 107 and the one of the pair of electrodes of the capacitor 109. One of a source and a drain of the transistor 111 is electrically connected to a terminal I. The other of the source and the drain of the transistor 111 is electrically connected to a terminal O.

For the transistor 111, any of a variety of semiconductors such as a semiconductor containing a semiconductor belonging to Group 14 of the periodic table (e.g., silicon), an organic semiconductor, a compound semiconductor, and an oxide semiconductor can be used. Moreover, an amorphous semiconductor, a microcrystalline semiconductor, a polycrystalline semiconductor, a single crystal semiconductor, or the like can be used. Specifically, such a semiconductor is used for a channel formation region of the transistor 111.

Examples of a transistor using a single crystal semiconductor are a bulk transistor using a single crystal semiconductor substrate and a thin film transistor using an SOI substrate. As a base substrate for the SOI substrate, a glass substrate or a semiconductor substrate can be used, for example. An example of a transistor using an amorphous semiconductor, a microcrystalline semiconductor, or a polycrystalline semiconductor is a thin film transistor provided over a glass substrate, a semiconductor substrate, or the like.

(Driving Method of Storage Circuit 103 and Logic Circuit 105)

A method for driving the storage circuit 103 and the logic circuit 105 illustrated in FIG. 1B will be described.

Data is retained (stored) in the storage circuit 103 in the following manner. First, the transistor 107 is turned on by a control signal Write input to its gate (a control signal input to the terminal W). Then, a signal potential corresponding to data Data (a signal potential input to the terminal D) is input to the one of the pair of electrodes of the capacitor 109 through the transistor 107 in the on state. In other words, the storage circuit 103 has a function of inputting the data Data to the capacitor 109 through the transistor 107.

After that, the transistor 107 is turned off by a control signal Write input to its gate (a control signal input to the terminal W), whereby the signal potential is held in the one of the pair of electrodes of the capacitor 109. At this time, the signal potential is also held in the terminal F. In such a manner, the data Data can be stored in the storage circuit 103.

The oxide semiconductor is used in the transistor 107, and thus, the off-state current (also referred to as leakage current) of the transistor 107 is extremely lower than that of a silicon-based transistor, for example. Consequently, the storage circuit 103 can hold the signal potential in the one of the pair of electrodes of the capacitor 109 and the terminal F for a long time while the transistor 107 is off. As a result, the storage circuit 103 can hold the data Data for a long time, for example, even after supply of power supply voltage to the semiconductor device is stopped.

Further, the drive voltage of the storage circuit 103 including the transistor 107 including the oxide semiconductor is lower than that of flash memory including a silicon-based transistor, for example. It is thus possible to achieve higher-speed operation and lower power consumption than the case of using the flash memory or the like.

In the logic circuit 105 in FIG. 1B, the signal potential is input to the gate of the transistor 111 and the on/off state of the transistor 111 is controlled. That is, electric conduction between the terminal I and the terminal O is controlled. Since the storage circuit 103 can retain the data Data for a long time, the circuit configuration of the logic circuit 105 can be maintained even after supply of the power supply voltage to the semiconductor device is stopped. "The circuit configuration of the logic circuit 105 is maintained" in FIG. 1B means that the on/off state of the transistor 111 (electric conduction or non-electric conduction between the terminal I and the terminal O) is maintained.

The transistor 111 is desired to operate at high speed, and thus a crystalline semiconductor with high mobility is preferably used. In particular, it is preferable to use a single crystal semiconductor and to use a semiconductor containing silicon whose crystallinity is easily increased. That is, the transistor 111 is preferably formed using single crystal silicon.

Stacking the transistor 107 and the transistor 111 makes it possible to reduce the circuit area. For example, the transistor 107 may be provided over the transistor 111 as illustrated in FIG. 7C. In that case, it is preferable that the transistor 107 including an oxide semiconductor be provided over the transistor 111 including single crystal silicon. FIG. 7D illustrates a specific example of a cross-sectional structure of the stacked transistors.

The cross-sectional structure in FIG. 7D corresponds to the circuit configuration in FIG. 1B. FIG. 7D illustrates a structure in which the transistor 107 including an oxide semiconductor and the capacitor 109 are provided over the transistor 111 including single crystal silicon.

The transistor 111 includes a single crystal silicon layer 131, a gate insulating layer 133, and a gate electrode 135. The transistor 107 includes an oxide semiconductor layer 137, a gate insulating layer 139, and a gate electrode 141. The capacitor 109 includes a pair of electrodes (one of which is referred to as one electrode 143 and the other of which is referred to as the other electrode 145) and an insulating layer 147 serving as a dielectric layer. The gate electrode 135 of the transistor 111 is electrically connected to the one electrode 143 of the capacitor 109 and one electrode 149 serving as a source electrode or a drain electrode (source/drain electrode 149) of the transistor 107.

In the example in FIG. 7D, the one electrode 143 of the capacitor 109 is a component extended from the source/drain electrode 149 of the transistor 107. The insulating layer 147 serving as the dielectric layer of the capacitor 109 is a component extended from the gate insulating layer 139 of the transistor 107. The other electrode 145 of the capacitor 109 is provided over the layer over which the gate electrode 141 of the transistor 107 is placed. By employing some or all of these structures, films, electrodes, and the like included in the elements can be fabricated using the same materials through the same steps, resulting in the reduction in costs and the number of steps.

A semiconductor device having the structure illustrated in FIG. 7D can achieve all of the following: high-speed operation, data retention, reduction in circuit area, and reduction in costs and the number of steps. Note that the cross-sectional structure of the semiconductor device is not limited to those illustrated in FIGS. 7C and 7D, and the transistor 111 may be provided over the transistor 107. Moreover, part of the transistor 107 overlaps with the transistor 111 in FIG. 7D; alternatively, the entire transistor 107 may overlap with the transistor 111. Further, the transistor 111 and the transistor 107 are not necessarily stacked; it is possible to employ a structure where the transistor 107 and the capacitor 109 are stacked or a structure where the transistor 111 and the capacitor 109 are stacked.

As described above, the logic circuit 105 can be controlled in accordance with the data Data stored in the storage circuit 103.

Figure 1C:
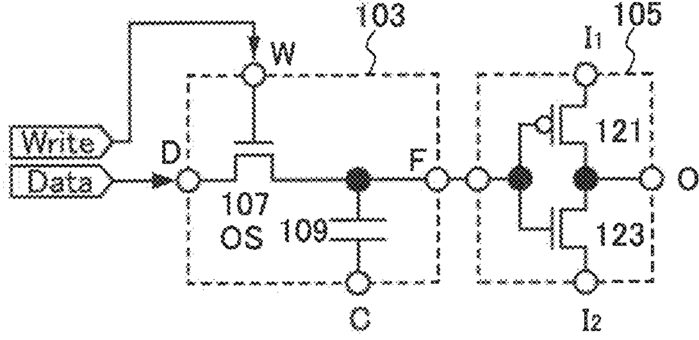

Note that FIG. 1B shows the case where the logic circuit 105 is one transistor; the logic circuit 105 may have another configuration. For example, the logic circuit 105 may include a CMOS circuit such as an inverter as illustrated in FIG. 1C. The operation of the logic circuit 105 in FIG. 1C is similar to that in FIG. 1B; the on/off states of a transistor 121 and a transistor 123 are controlled in accordance with the data Data stored in the storage circuit 103. That is, electric conduction between a terminal $I_1$ and the terminal O or electric conduction between a terminal $I_2$ and the terminal O is selected. Note that a high power supply potential can be input to the terminal $I_1$, and a low power supply potential can be input to the terminal $I_2$.

(Circuit Configurations and Driving Method of Storage Circuit 103 and Logic Circuit Unit 101)

Figure 2A:
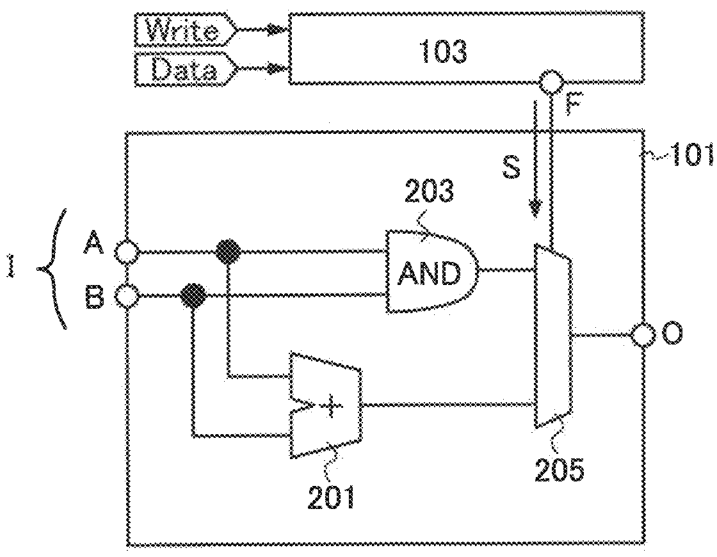
FIGS. 2A and 2B each illustrate an example of a semiconductor device.

FIG. 2A illustrates examples of circuit configurations of the storage circuit 103 and the logic circuit unit 101.

The logic circuit unit 101 includes an adder 201, an AND circuit 203, and a selector circuit 205 as the equivalent of the logic circuit 105 in FIG. 1A. That is, the logic circuit unit 101 includes operation circuits such as the adder 201 and the AND circuit 203, and the selector circuit 205. Any of the other above-described logic circuits may be alternatively used. In addition, the logic circuit unit 101 may include an element such as a resistor or a diode.

As the adder 201 and the AND circuit 203, known circuits are used. The adder 201 and the AND circuit 203 each have a function of performing an operation based on inputs from a terminal A and a terminal B and inputting the operation result to the selector circuit 205.

An example of the selector circuit 205 is a multiplexer. The selector circuit 205 is electrically connected to the terminal F of the storage circuit 103. The data Data of the storage circuit 103 is input to the selector circuit 205 as a selection signal S. The selector circuit 205 selects one of inputs from the adder 201 and the AND circuit 203 in accordance with the data Data, and outputs the selected input to the terminal O. That is, the selector circuit 205 has a function of selecting one from operation results of the operation circuits such as the adder 201 and the AND circuit 203 in accordance with the data Data. Furthermore, the selector circuit 205 can select a plurality of operation circuits depending on the configuration of the logic circuit unit 101.

Figure 2B:
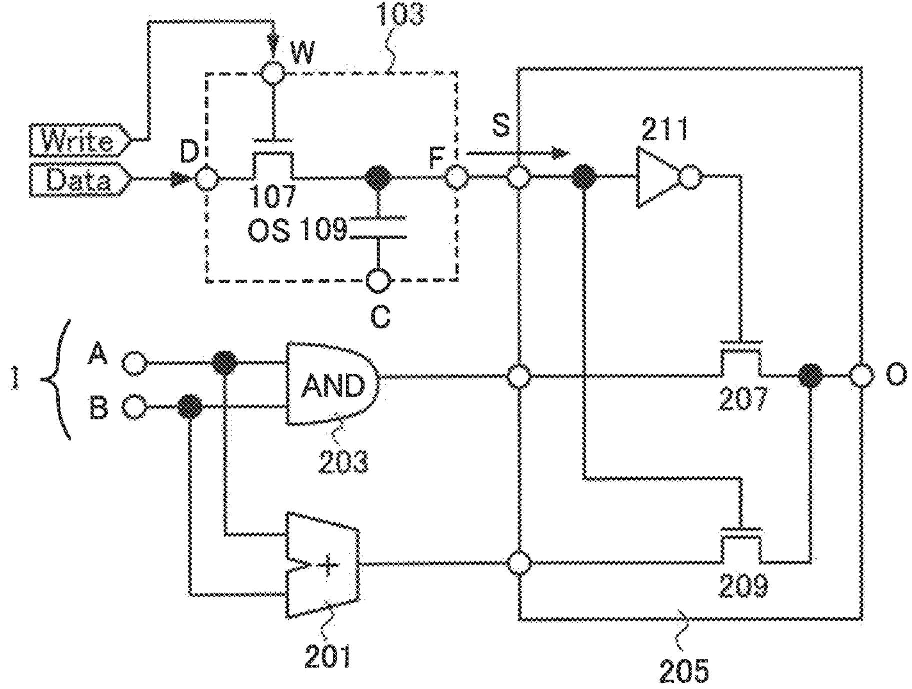

FIG. 2B illustrates specific circuit configurations of the storage circuit 103 and the selector circuit 205.

The selector circuit 205 is an example of a multiplexer with two inputs (the input from the AND circuit and the input from the adder), and includes a transistor 207, a transistor 209, and an inverter 211. Here, the transistors 207 and 209 have the same polarity. Note that the circuit configuration of the selector circuit 205 is not limited to that in FIG. 2B as long as electrical connection between the operation circuit and the terminal O can be controlled by a transistor.

Figures 27A, 27B:
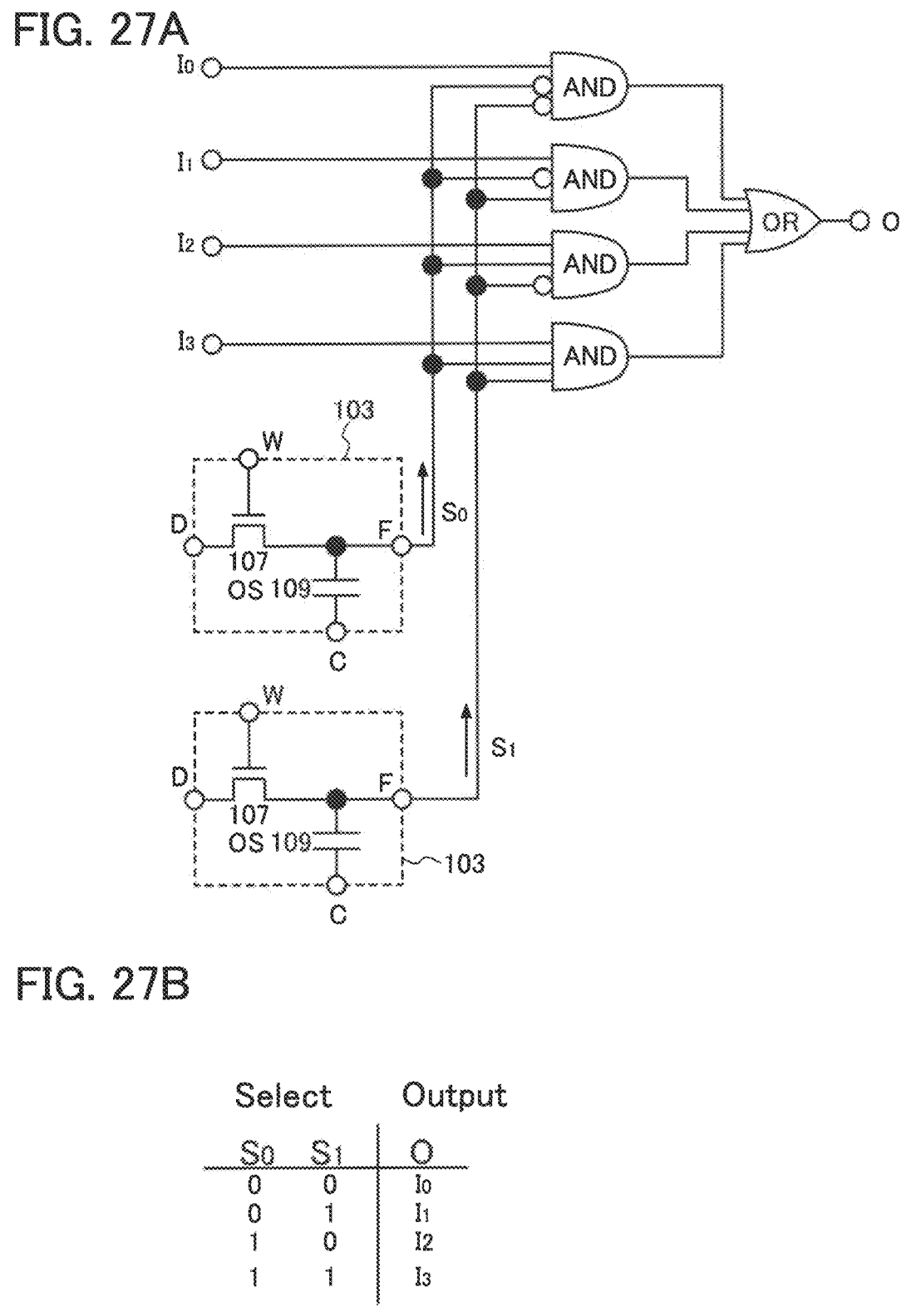

A gate of the transistor 207 is electrically connected to the terminal F through the inverter 211. One of a source and a drain of the transistor 207 is electrically connected to the AND circuit 203. A gate of the transistor 209 is electrically connected to the terminal F. One of a source and a drain of the transistor 209 is electrically connected to the adder 201. The other of the source and the drain of the transistor 207 and the other of the source and the drain of the transistor 209 are electrically connected to the terminal O. Note that the number of inputs of the multiplexer can be changed to a given number m (m: a positive integer) as appropriate depending on the configuration of the logic circuit unit 101. In addition, the number of selection signals S can be determined in accordance with the number of inputs. The number of storage circuits 103 can be determined in accordance with the number of selection signals S. For example, when the multiplexer has four inputs (m=4: $I_0$, $I_1$, $I_2$, and $I_3$), there are four kinds of outputs from the terminal O; thus, two selection signals $S_0$ and $S_1$ ("$S_0S_1$"="00", "01", "10", and "11") are used and two storage circuits 103 corresponding to these selection signals are provided (see FIGS. 27A and 27B).

The circuit in FIG. 2B can be driven in a manner similar to those of the circuits in FIGS. 1B and 1C. First, the storage circuit 103 inputs the data Data which is to be the selection signal S to the selector circuit 205 through the transistor 107. Next, the selector circuit 205 controls the on/off state of the transistor 209 in accordance with the data Data, and controls the on/off state of the transistor 207 in accordance with inversion data of the data Data. Then, when the transistor 207 is on and the transistor 209 is off, the input from the AND circuit 203 is selected and output to the terminal O. On the other hand, when the transistor 209 is on and the transistor 207 is off, the input from the adder 201 is selected and output to the terminal O.

Figure 3:
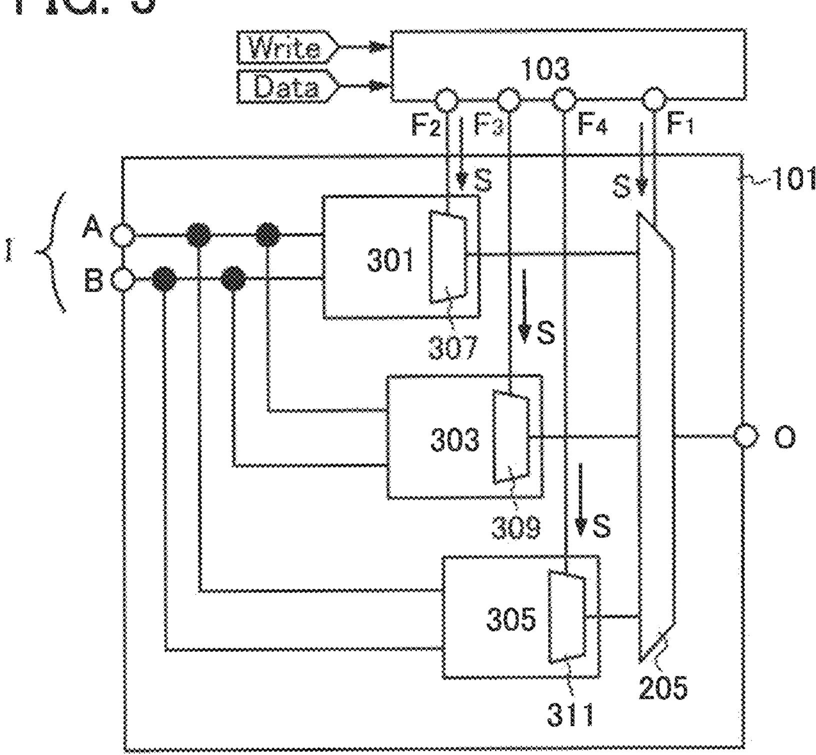
FIG. 3 illustrates an example of a semiconductor device.

In such a manner, the selector circuit 205 is controlled in accordance with the data Data of the storage circuit 103, and one of the operation results of the adder 201 and the AND circuit 203 is selected. For simplicity, only the adder 201, the AND circuit 203, and the selector circuit 205 are shown in FIGS. 2A and 2B as the logic circuit 105 in the logic circuit unit 101; the logic circuit unit may have another configuration. FIG. 3 illustrates a more practical configuration of a semiconductor device.

FIG. 3 is a block diagram of a semiconductor device in which a general ALU is used as the logic circuit unit 101. The logic circuit unit 101 includes an arithmetic operation unit 301 including a combination of an adder, a subtractor, and the like; a logic operation unit 303 including a combination of an AND circuit, an OR circuit, and the like; a shift operation unit 305 including a shift circuit; and the selector circuit 205 that selects these units to output their outputs, such as a multiplexer. The operation units 301, 303, and 305 respectively include selector circuits 307, 309, and 311 (e.g., multiplexers), and a combination of the circuit configurations of the logic circuits in each operation unit can be changed.

Like the selector circuit 205, the selector circuits 307, 309, and 311 in the operation units are each controlled in accordance with the data Data of the storage circuit 103, which is to be the selection signal S. In FIG. 3, the storage circuit 103 is a storage circuit unit including plural pairs of the transistors 107 and the capacitors 109 as in FIG. 1B, and the data Data is output from terminals $F_1$ to $F_4$. Note that the number of the pairs can be determined by the number of inputs of the selector circuits 205, 307, 309, and 311. In the case where the same data Data is output from the terminals $F_1$ to $F_4$, the storage circuit 103 such as that in FIG. 1B may be shared with the selector circuits 205, 307, 309, and 311, in which case the semiconductor device can be downsized.

Since the storage circuit 103 can retain the data Data for a long time, the circuit configuration of the logic circuit unit 101 can be maintained even after supply of the power supply voltage to the semiconductor device is stopped. Moreover, the effects of increasing the operation speed and reducing power consumption of the storage circuit 103 are more significant as the circuit configuration is complicated as illustrated in FIG. 3.

When a plurality of circuits such as those illustrated in FIGS. 2A and 2B and FIG. 3 are provided, the number of bits of signals input from the terminal A and the terminal B can be increased. In other words, an n-bit logic circuit unit 101 (n: a positive integer) can be configured.

This embodiment can be implemented in combination with any of the other embodiments as appropriate.

Embodiment 2

In this embodiment, an example of a semiconductor device different from that in Embodiment 1 will be described.

Figures 4A, 4B:
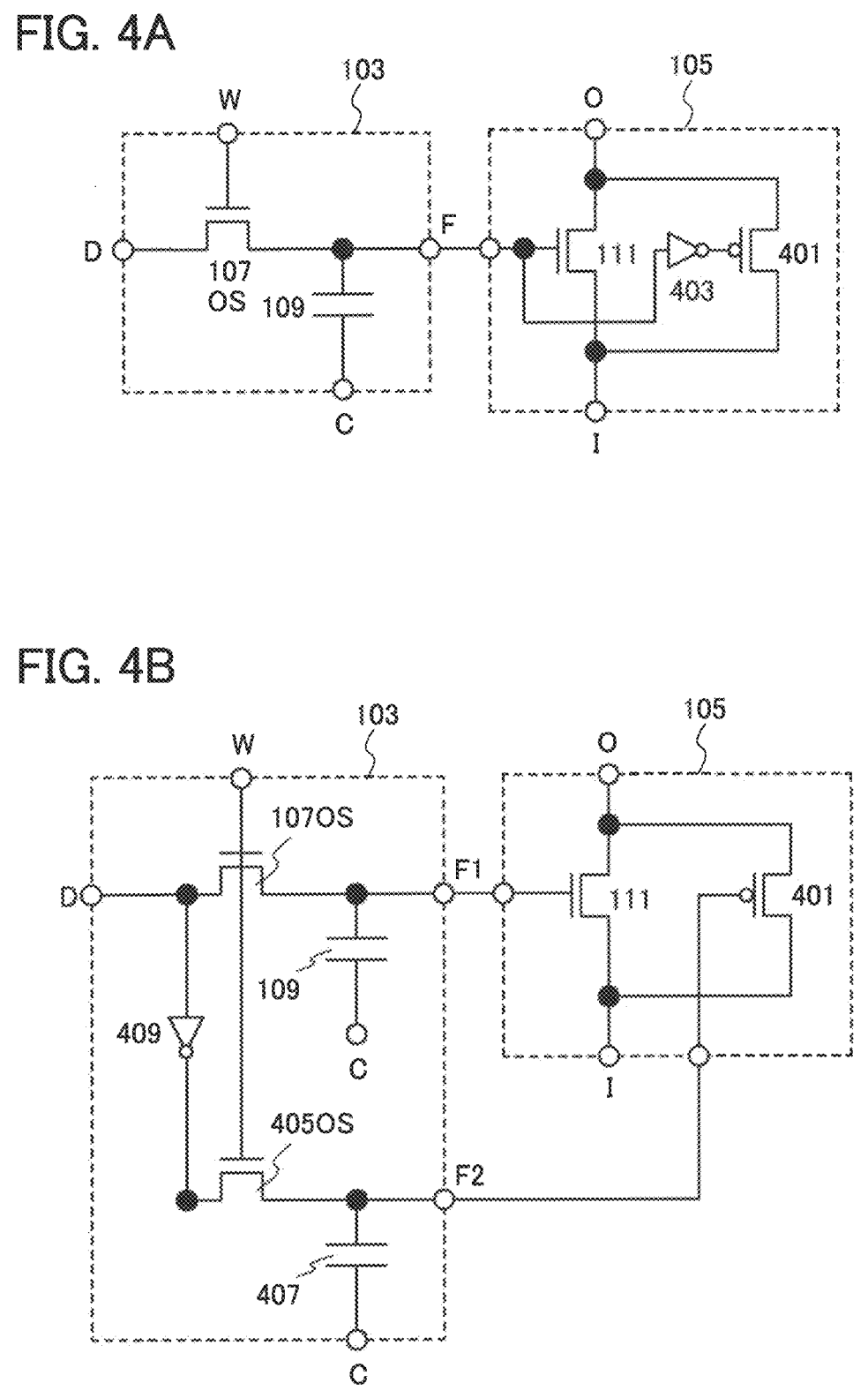

FIGS. 4A and 4B each illustrate a variation example of FIG. 1B. First, the example in FIG. 4A is described. The storage circuit 103 is the same as that in FIG. 1B and the like.

The logic circuit 105 in FIG. 4A includes the transistor 111, a transistor 401, and an inverter 403. The transistor 111 and the transistor 401 are electrically connected in parallel to each other between the terminal I and the terminal O. That is, one of the source and the drain of the transistor 111 and one of a source and a drain of the transistor 401 are electrically connected to the terminal I, and the other of the source and the drain of the transistor 111 and the other of the source and the drain of the transistor 401 are electrically connected to the terminal O.

The transistors 111 and 401 have different polarities; one of the transistors 111 and 401 is an n-channel transistor and the other thereof is a p-channel transistor. The data Data of the storage circuit 103 is input to the gate of the transistor 111. Inversion data of the data Data is input to a gate of the transistor 401. The use of the transistors 111 and 401 with different polarities as in FIG. 4A makes it possible to suppress the voltage shift by the threshold voltages of the transistors 111 and 401.

Next, the example in FIG. 4B is described.

The storage circuit 103 in FIG. 4B includes the transistor 107, the capacitor 109, a transistor 405, a capacitor 407, and an inverter 409. The transistor 107 and the capacitor 109 are the same as those in FIG. 1B and the like. A gate of the transistor 405 is electrically connected to the terminal W. One of a source and a drain of the transistor 405 is electrically connected to the terminal D through the inverter 409. The other of the source and the drain of the transistor 405 is electrically connected to one of a pair of electrodes of the capacitor 407 and the terminal $F_2$.

In the logic circuit 105 in FIG. 4B, the transistor 111 and the transistor 401 with different polarities are electrically connected in parallel to each other between the terminal I and the terminal O as in FIG. 4A. The data Data of the storage circuit 103 is input to the gate of the transistor 111. Inversion data of the data Data is input to the gate of the transistor 401. As in FIG. 4A, the use of the transistors 111 and 401 with different polarities makes it possible to suppress the voltage shift by the threshold voltages of the transistors 111 and 401.

This embodiment can be implemented in combination with any of the other embodiments as appropriate.

Embodiment 3

In this embodiment, an example of a semiconductor device different from those in Embodiments 1 and 2 will be described.

Figure 5A:
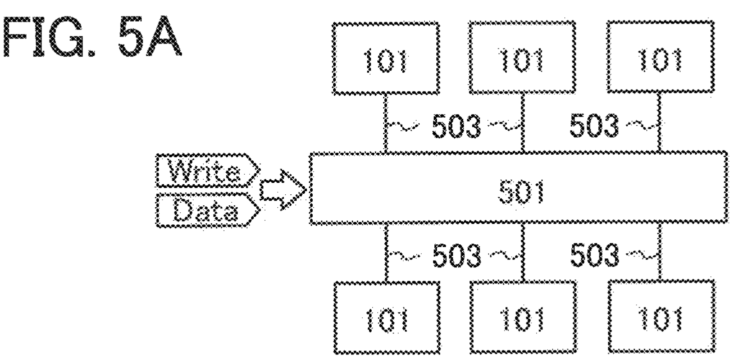
FIGS. 5A to 5C each illustrate an example of a semiconductor device.

A semiconductor device in FIG. 5A includes a plurality of logic circuit units 101 and a connector unit 501. The logic circuit unit 101 is the same as those in FIGS. 1A to 1C, FIGS. 2A and 2B, and FIG. 3 and can be an ALU or the like.

Figure 5B:
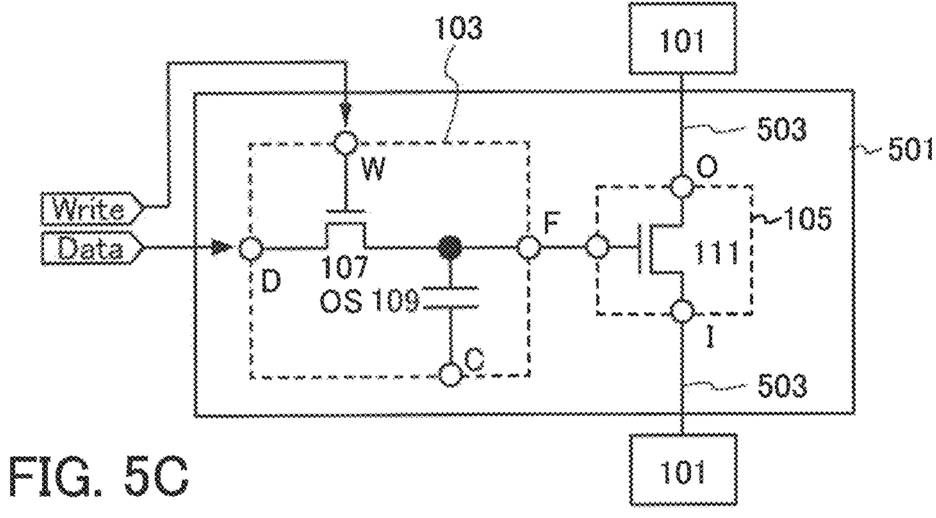

The connector unit 501 has a function of controlling electrical continuity of wirings 503 with which the plurality of logic circuit units 101 are electrically connected to each other. FIG. 5B illustrates the connector unit 501 in detail.

The circuit configuration and driving method of the connector unit 501 in FIG. 5B are the same as those in FIG. 1B; the on/off state of the transistor 111 is controlled in accordance with the data Data of the storage circuit 103. That is, electric conduction between the terminal I and the terminal O is controlled. The terminal I and the terminal O are electrically connected to different logic circuit units 101, and electrical connection between the logic circuit units 101 is controlled by controlling electric conduction between the terminal I and the terminal O. Note that the logic circuit 105 is not limited to a circuit including one transistor 111, and may include one or a plurality of elements functioning as switches (e.g., transistors).

As described above, the transistor 111 in the connector unit 501 has a function of controlling electrical connection between one and another of the plurality of logic circuit units 101 in accordance with the data Data. In addition, the terminal I and the terminal O may be electrically connected to the terminal A and the terminal O, respectively, of one logic circuit unit 101 (see FIG. 3 and the like). That is, the output of one logic circuit unit 101 may be fed back to the input. Note that the storage circuit 103 may be provided outside the connector unit 501.

Figure 5C:
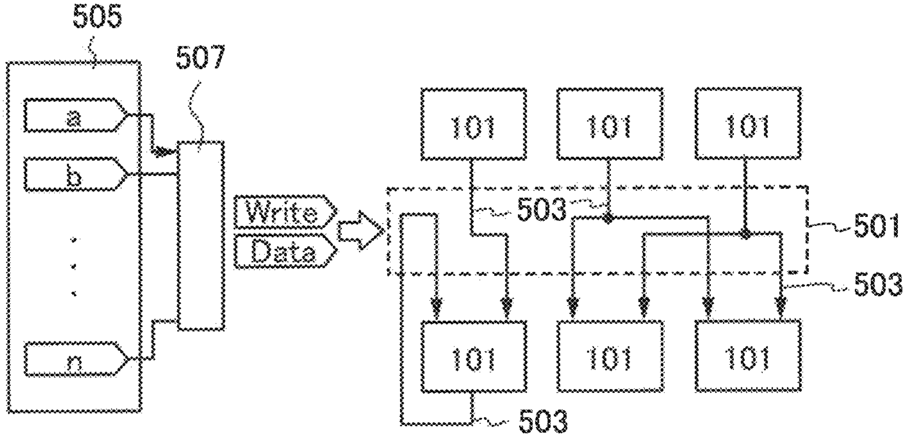

FIG. 5C illustrates an example of electrical connection between the plurality of logic circuit units 101. A semiconductor device in FIG. 5C includes a memory 505 and a selector circuit 507. Information a to information n, such as the control signal Write and the data Data, are stored in the memory 505. The selector circuit 507 is a multiplexer or the like, and selects and outputs the information to the storage circuit 103 in the connector unit 501.

FIG. 5C illustrates a state where the information a is selected and the wirings 503 between the logic circuit units 101 are connected as indicated by arrows. The connection relation is changed when any of the information b to information n is selected. Note that only the wirings 503 included in the connection relation are shown in FIG. 5C.

In the semiconductor device in FIG. 5C, the storage circuit 103 included in the connector unit 501 can retain the data Data for a long time; consequently, the connection relation between the plurality of logic circuit units 101 can be maintained even after supply of the power supply voltage to the semiconductor device is stopped. Since the drive voltage of the transistor 107 including an oxide semiconductor in the connector unit 501 is low, the connection relation can be changed at higher speed with lower power consumption as compared to the case of using flash memory, for example.

Note that the storage circuit 103 may be used in the memory 505. In that case, the memory 505 can also operate at high speed with low power consumption. Moreover, the connector unit 501 may have the configuration illustrated in FIG. 4A or FIG. 4B.

This embodiment can be implemented in combination with any of the other embodiments as appropriate.

Embodiment 4

In this embodiment, an example of a semiconductor device obtained by a combination of Embodiment 1 and Embodiment 3 will be described.

Figure 6A:
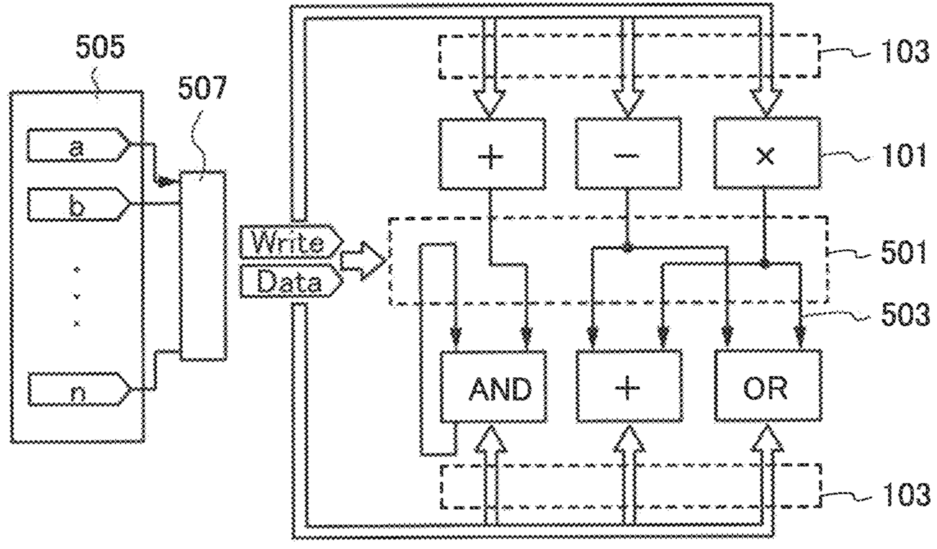
FIGS. 6A and 6B each illustrate an example of a semiconductor device.

A semiconductor device in FIG. 6A includes a plurality of logic circuit units 101 (represented by "+", "AND", and the like), the connector unit 501, the storage circuit 103, the memory 505, and the selector circuit 507. The memory 505 and the selector circuit 507 may be provided outside the semiconductor device.

The storage circuit 103 has a function of maintaining the circuit configuration of the plurality of logic circuit units 101 as described in Embodiment 1 and the like.

The connector unit 501 has a function of maintaining the connection relation between the plurality of logic circuit units 101 as described in Embodiment 3 and the like.

Each of the information a to information n stored in the memory 505 includes both data on the circuit configuration and data on the connection relation. The information is held in the storage circuit 103 and the connector unit 501, whereby the semiconductor device can maintain both the circuit configuration and the connection relation even when supply of the power supply voltage is stopped. Since the drive voltage of the transistor including an oxide semiconductor in the storage circuit 103 is low, the circuit configuration and the connection relation can be changed at high speed with low power consumption.

This embodiment can be implemented in combination with any of the other embodiments as appropriate.

Embodiment 5

In this embodiment, an example of a configuration for reducing power consumption of a semiconductor device will be described.

Figure 6B:
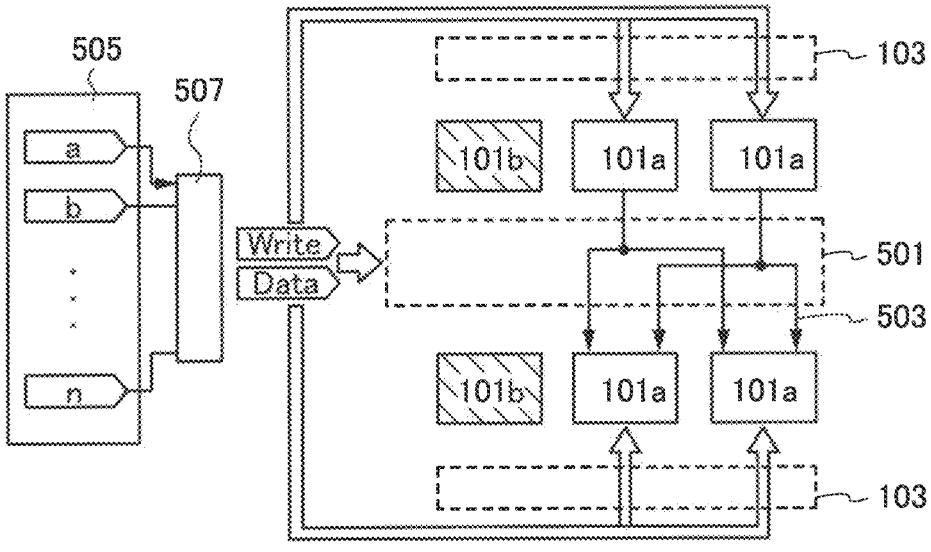

FIG. 6B illustrates a configuration of a semiconductor device in the case where supply of the power supply voltage to an unused circuit is stopped. Note that the configurations of the logic circuit unit 101 (logic circuit units 101*a* and 101*b*), the connector unit 501, the storage circuit 103, and the like are the same as those in the other embodiments.

The power supply voltage is supplied to the logic circuit units 101*a* that are to be used, part of the storage circuit 103 which supplies the data Data to the logic circuit units 101*a*, and a storage circuit of the connector unit 501 which controls the connection relation between the logic circuit units 101*a*.

In contrast, the power supply voltage stops being supplied to the logic circuit units 101*b* that are not to be used, part of the storage circuit 103 which supplies the data Data to the logic circuit units 101*b*, and a storage circuit of the connector unit 501 which controls the connection relation between the logic circuit units 101*b*. Alternatively, supply of the power supply voltage to any of these may be stopped. That is, the power supply voltage may stop being supplied only to the logic circuit units 101*b* that are not to be used.

As an example of stopping supply of the power supply voltage, supply of the high power supply potential and supply of the low power supply potential to the inverter shown as the logic circuit 105 in FIG. 1C can be stopped by interrupting electrical connection between the terminals $I_1$ and $I_2$ and power supply lines by using a switch or the like. Similarly, supply of the high power supply potential and supply of the low power supply potential to the adder 201, the AND circuit 203, the selector circuit 205, and the like in FIG. 2A can be stopped by using a switch or the like.

By stopping supply of the power supply voltage to an unused circuit as described above, power consumption of the semiconductor device can be reduced.

This embodiment can be implemented in combination with any of the other embodiments as appropriate.

Embodiment 6

In this embodiment, examples of a field-effect transistor that includes an oxide semiconductor layer and can be applied to the transistor in the storage circuit in the above embodiments will be described.

Examples of transistors in this embodiment will be described with reference to FIGS. 7A and 7B.

Figure 7A:
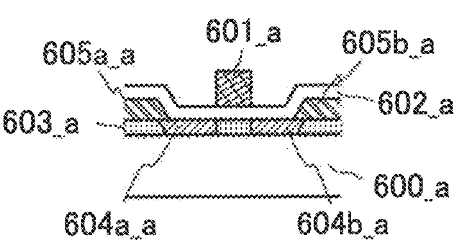
FIGS. 7A to 7D each illustrate an example of a semiconductor device.

The transistor illustrated in FIG. 7A includes a conductive layer 601_*a*, an insulating layer 602_*a*, a semiconductor layer 603_*a*, a conductive layer 605*a*_*a*, and a conductive layer 605*b*_*a*.

The semiconductor layer 603_*a* includes a region 604*a*_*a* and a region 604*b*_*a*. The region 604*a*_*a* and the region 604*b*_*a* are positioned apart from each other and doped with a dopant. Note that a region between the region 604*a*_*a* and the region 604*b*_*a* serves as a channel formation region. The semiconductor layer 603_*a* is provided over an element formation layer 600_*a*. Note that it is not necessary to provide the region 604*a*_*a* and the region 604*b*_*a*.

The conductive layer 605*a*_*a* and the conductive layer 605*b*_*a* are provided over the semiconductor layer 603_*a* and electrically connected to the semiconductor layer 603_*a*. Side surfaces of the conductive layers 605*a*_*a* and 605*b*_*a* are tapered.

The conductive layer 605*a*_*a* overlaps part of the region 604*a*_*a*; however, this embodiment is not limited to this structure. When the conductive layer 605*a*_*a* overlaps part of the region 604*a*_*a*, the resistance between the conductive layer 605*a*_*a* and the region 604*a*_*a* can be low. Further, a region of the semiconductor layer 603_*a* which overlaps with the conductive layer 605*a*_*a* may be all the region 604*a*_*a*.

The conductive layer 605*b*_*a* overlaps part of the region 604*b*_*a*; however, this embodiment is not limited to this structure. When the conductive layer 605*b*_*a* overlaps part of the region 604*b*_*a*, the resistance between the conductive layer 605*b*_*a* and the region 604*b*_*a* can be low. Further, a region of the semiconductor layer 603_*a* which overlaps with the conductive layer 605*b*_*a* may be all the region 604*b*_*a*.

The insulating layer 602_*a* is provided over the semiconductor layer 603_*a*, the conductive layer 605*a*_*a*, and the conductive layer 605*b*_*a*.

The conductive layer 601_*a* is provided over part of the insulating layer 602_*a*, and overlaps the semiconductor layer 603_*a* with the insulating layer 602_*a* placed therebetween. A region of the semiconductor layer 603_*a*, which overlaps with the conductive layer 601_*a* with the insulating layer 602_*a* placed therebetween, serves as the channel formation region.

Figure 7B:
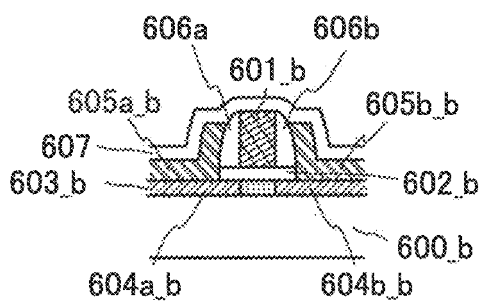
Figure 7C:
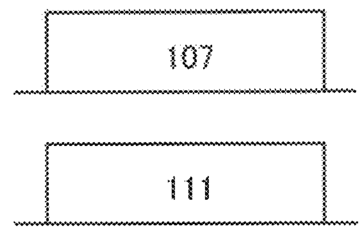
Figure 7D:
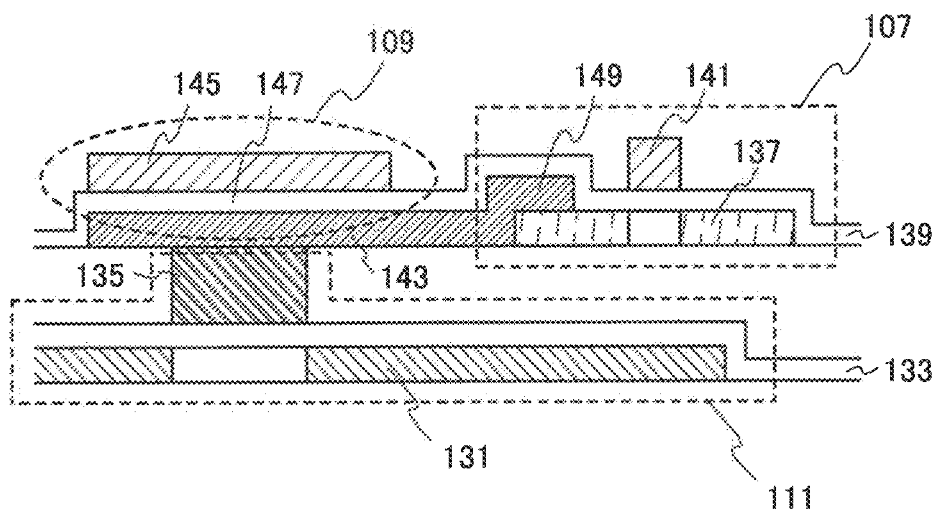

The transistor illustrated in FIG. 7B includes a conductive layer 601_*b*, an insulating layer 602_*b*, a semiconductor layer 603_*b*, a conductive layer 605*a*_*b*, a conductive layer 605*b*_*b*, an insulating layer 606*a*, an insulating layer 606*b*, and an insulating layer 607.

The semiconductor layer 603_*b* includes a region 604*a*_*b* and a region 604*b*_*b*. The region 604*a*_*b* and the region 604*b*_*b* are positioned apart from each other and doped with a dopant. The semiconductor layer 603_*b* is provided over the conductive layers 605*a*_*b* and 605*b* b and an element formation layer 600_*b*, for example, and electrically connected to the conductive layers 605*a*_*b* and 605*b*_*b*. Note that it is not necessary to provide the region 604*a*_*b* and the region 604*b*_*b*.

The insulating layer 602_*b* is provided over part of the semiconductor layer 603_*b*.

The conductive layer 601_*b* is provided over part of the insulating layer 602_*b*, and overlaps the semiconductor layer 603_*b* with the insulating layer 602_*b* placed therebetween. A region of the semiconductor layer 603_*b*, which overlaps with the conductive layer 601_*b* with the insulating layer 602_*b* placed therebetween, serves as the channel formation region of the transistor. Note that an insulating layer may be provided over the conductive layer 601_*b*.

The insulating layer 606*a* is provided over the insulating layer 602_*b* and is in contact with one of a pair of side surfaces of the conductive layer 601_*b*.

The insulating layer 606*b* is provided over the insulating layer 602_*b* and is in contact with the other of the pair of side surfaces of the conductive layer 601_*b*.

Note that the dopant concentration of the portions of the regions 604*a*_*b* and 604*b*_*b*, which overlap with the insulating layers 606*a* and 606*b* with the insulating layer 602_*b* placed therebetween, may be lower than that of the portions of the regions 604*a*_*b* and 604*b*_*b*, which do not overlap with the insulating layers 606*a* and 606*b*.

The conductive layers 605*a*_*b* and 605*b*_*b* are provided over the semiconductor layer 603_*b*.

The conductive layer 605*a*_*b* is electrically connected to the region 604*a*_*b* and is in contact with the insulating layer 606*a*.

The conductive layer 605*b*_*b* is electrically connected to the region 604*b*_*b* and is in contact with the insulating layer 606*b*.

The insulating layer 607 is provided over the conductive layer 601_*b*, the conductive layers 605*a*_*b* and 605*b*_*b*, and the insulating layers 606*a* and 606*b*.

Next, the components illustrated in FIGS. 7A and 7B will be described.

As the element formation layers 600_*a* and 600_*b*, insulating layers or substrates having insulating surfaces can be used, for example. Further, layers over which elements are formed in advance can be used as the element formation layers 600_*a* and 600_*b*.

Each of the conductive layers 601_*a* and 601_*b* has a function of a gate of the transistor. Note that a layer functioning as a gate of the transistor can be called a gate electrode or a gate wiring.

As the conductive layers 601_*a* and 601_*b*, it is possible to use, for example, a layer of a metal material such as molybdenum, magnesium, titanium, chromium, tantalum, tungsten, aluminum, copper, neodymium, or scandium or an alloy material containing any of these materials as a main component. Moreover, the conductive layers 601_*a* and 601_*b* can be a stack of layers containing materials applicable to the conductive layers 601_*a* and 601_*b*.

Each of the insulating layers 602_*a* and 602_*b* has a function of a gate insulating layer of the transistor.

Each of the insulating layers 602_*a* and 602_*b* can be, for example, a silicon oxide layer, a silicon nitride layer, a silicon oxynitride layer, a silicon nitride oxide layer, an aluminum oxide layer, an aluminum nitride layer, an aluminum oxynitride layer, an aluminum nitride oxide layer, a hafnium oxide layer, or a lanthanum oxide layer. Moreover, the insulating layers 602_*a* and 602_*b* can be a stack of layers containing materials applicable to the insulating layers 602_*a* and 602_*b*.

Alternatively, as the insulating layers 602_*a* and 602_*b*, an insulating layer of a material containing, for example, an element that belongs to Group 13 in the periodic table and oxygen can be used. For example, when the semiconductor layers 603_*a* and 603_*b* contain a Group 13 element, the use of insulating layers containing a Group 13 element as insulating layers in contact with the semiconductor layers 603_*a* and 603_*b* makes the state of interfaces between the insulating layers and the oxide semiconductor layers favorable.

Examples of the material containing a Group 13 element and oxygen are gallium oxide, aluminum oxide, aluminum gallium oxide, and gallium aluminum oxide. Note that aluminum gallium oxide refers to a substance in which the amount of aluminum is larger than that of gallium in atomic percent, and gallium aluminum oxide refers to a substance in which the amount of gallium is larger than or equal to that of aluminum in atomic percent. For example, it is possible to use a material represented by $Al_2O_x$ ($x=3+\alpha$, where $\alpha$ is larger than 0 and smaller than 1), $Ga_2O_x$ ($x=3+\alpha$, where $\alpha$ is larger than 0 and smaller than 1), or $Ga_xAl_{2-x}O_{3+\alpha}$ (x is larger than 0 and smaller than 2 and $\alpha$ is larger than 0 and smaller than 1).

The insulating layers 602_*a* and 602_*b* can be a stack of layers of materials applicable to the insulating layers 602_*a* and 602_*b*. For example, the insulating layers 602_*a* and 602_*b* can be a stack of layers containing gallium oxide represented by $Ga_2O_x$. Alternatively, the insulating layers 602_*a* and 602_*b* may be a stack of an insulating layer containing gallium oxide represented by $Ga_2O_x$ and an insulating layer containing aluminum oxide represented by $Al_2O_x$.

Each of the semiconductor layers 603_*a* and 603_*b* functions as a layer in which a channel of the transistor is formed. Examples of an oxide semiconductor applicable to the semiconductor layers 603_*a* and 603_*b* are In-based oxide (e.g., indium oxide), Sn-based oxide (e.g., tin oxide), and Zn-based oxide (e.g., zinc oxide).

As the metal oxide, a four-component metal oxide, a three-component metal oxide, or a two-component metal oxide can also be used, for example. Note that a metal oxide that can be used as the oxide semiconductor may include at least one of gallium, tin, hafnium, and aluminum as a stabilizer for reducing variation in characteristics. Further, a metal oxide that can be used as the oxide semiconductor may include one or plural kinds of the following materials as a stabilizer: lanthanum, cerium, praseodymium, neodymium, samarium, europium, gadolinium, terbium, dysprosium, holmium, erbium, thulium, ytterbium, and lutetium, which are lanthanoid. In addition, a metal oxide that can be used as the oxide semiconductor may contain silicon oxide.

Examples of a four-component metal oxide are an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, and an In—Hf—Al—Zn-based oxide.

Examples of a three-component metal oxide are an In—Ga—Zn-based oxide (also referred to as IGZO), an In—Sn—Zn-based oxide, an In—Al—Zn-based oxide, Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, and an In—Lu—Zn-based oxide.

Examples of a two-component metal oxide are an In—Zn-based oxide, a Sn—Zn-based oxide, an Al—Zn-based oxide, a Zn—Mg-based oxide, a Sn—Mg-based oxide, an In—Mg-based oxide, an In—Sn-based oxide, and an In—Ga-based oxide.

Note that for example, an In—Ga—Zn-based oxide refers to an oxide containing In, Ga, and Zn, and there is no limitation on the composition ratio of In, Ga, and Zn. The In—Ga—Zn-based oxide may contain a metal element other than In, Ga, and Zn.

As the oxide semiconductor, a material represented by $InLO_3(ZnO)_m$ (m is larger than 0) can be used. Here, L in $InLO_3(ZnO)_m$ represents one or more metal elements selected from Ga, Al, Mn, and Co.

For example, as the oxide semiconductor, an In—Ga—Zn-based oxide with an atomic ratio of In:Ga:Zn=1:1:1 (=1/3:1/3:1/3) or In:Ga:Zn=2:2:1 (=2/5:2/5:1/5), or any of oxides whose composition is in the neighborhood of the above compositions can be used. Moreover, as the oxide semiconductor, an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8) or any of oxides whose composition is in the neighborhood of the above compositions can be used.

Without limitation to the materials given above, a material with an appropriate composition can be used depending on needed semiconductor characteristics (e.g., mobility, threshold voltage, and variation). In order to obtain the needed semiconductor characteristics, it is preferable that the carrier density, the impurity concentration, the defect density, the atomic ratio between a metal element and oxygen, the interatomic distance, the density, and the like be set to appropriate values.

The oxide semiconductor may be either single crystal or non-single-crystal. In the latter case, the oxide semiconductor may be either amorphous or polycrystal. Further, the oxide semiconductor may have either an amorphous structure including a portion having crystallinity or a non-amorphous structure.

As the semiconductor layers 603_*a* and 603_*b*, it is possible to use a layer of an oxide semiconductor including a crystal with c-axis alignment (c-axis aligned crystalline oxide semiconductor (CAAC-OS)), which has a triangular or hexagonal atomic arrangement when seen from the direction of an a-b plane, a surface, or an interface. In the crystal, metal atoms are arranged in a layered manner or metal atoms and oxygen atoms are arranged in a layered manner along the c-axis, and the direction of the a-axis or the b-axis is varied in the a-b plane (the crystal rotates around the c-axis).

In a broad sense, a CAAC means a non-single crystal including a phase which has a triangular, hexagonal, regular triangular, or regular hexagonal atomic arrangement when seen from the direction perpendicular to the a-b plane and in which metal atoms are arranged in a layered manner or metal atoms and oxygen atoms are arranged in a layered manner when seen from the direction perpendicular to the c-axis direction.

The CAAC is not single crystal, but this does not mean that the CAAC is composed of only an amorphous component. Although the CAAC includes a crystallized portion (crystalline portion), a boundary between one crystalline portion and another crystalline portion is not clear in some cases.

In the case where oxygen is included in the CAAC, nitrogen may be substituted for part of oxygen included in the CAAC. The c-axes of individual crystalline portions included in the CAAC may be aligned in one direction (e.g., a direction perpendicular to a surface of a substrate over which the CAAC is formed or a surface of the CAAC). Alternatively, the normals of the a-b planes of the individual crystalline portions included in the CAAC may be aligned in one direction (e.g., a direction perpendicular to a surface of a substrate over which the CAAC is formed or a surface of the CAAC).

The CAAC becomes a conductor, a semiconductor, or an insulator depending on its composition or the like. The CAAC transmits or does not transmit visible light depending on its composition or the like.

An example of such a CAAC is a crystal which is formed into a film shape and has a triangular or hexagonal atomic arrangement when observed from the direction perpendicular to a surface of the film or a surface of a substrate, and in which metal atoms are arranged in a layered manner or metal atoms and oxygen atoms (or nitrogen atoms) are arranged in a layered manner when a cross section of the film is observed.

As the oxide semiconductor, it is possible to use a semiconductor material with a composition represented by $In_PGa_QO_R(ZnO)_M$ ($0<P<2$, $0<Q<2$, and M=1 to 3) as the entire layer including a c-axis-aligned crystalline region with a composition represented by $In_{1+\sigma}Ga_{1-\sigma}O_3(ZnO)_M$ ($0<\sigma<1$ and M=1 to 3).

For example, in the case where the semiconductor layers 603_*a* and 603_*b* are oxide semiconductor layers containing the CAAC and the channel length of the transistor is 30 nm, a short-channel effect can be prevented even when the semiconductor layers 603_*a* and 603_*b* have a thickness of about 5 nm, for instance.

Examples of a crystal structure of the CAAC-OS will be described with reference to FIGS. 8A to 8E, FIGS. 9A to 9C, and FIGS. 10A to 10C. In FIGS. 8A to 8E, FIGS. 9A to 9C, and FIGS. 10A to 10C, the vertical direction corresponds to the c-axis direction and a plane perpendicular to the c-axis direction corresponds to the a-b plane, unless otherwise specified. Note that an "upper half" and a "lower half" refer to an upper half above the a-b plane and a lower half below the a-b plane (an upper half and a lower half with respect to the a-b plane). Furthermore, in FIGS. 8A to 8E, O surrounded by a circle represents tetracoordinate O and O surrounded by a double circle represents tricoordinate O.

Figures 8A, 8B, 8C, 8D, 8E:
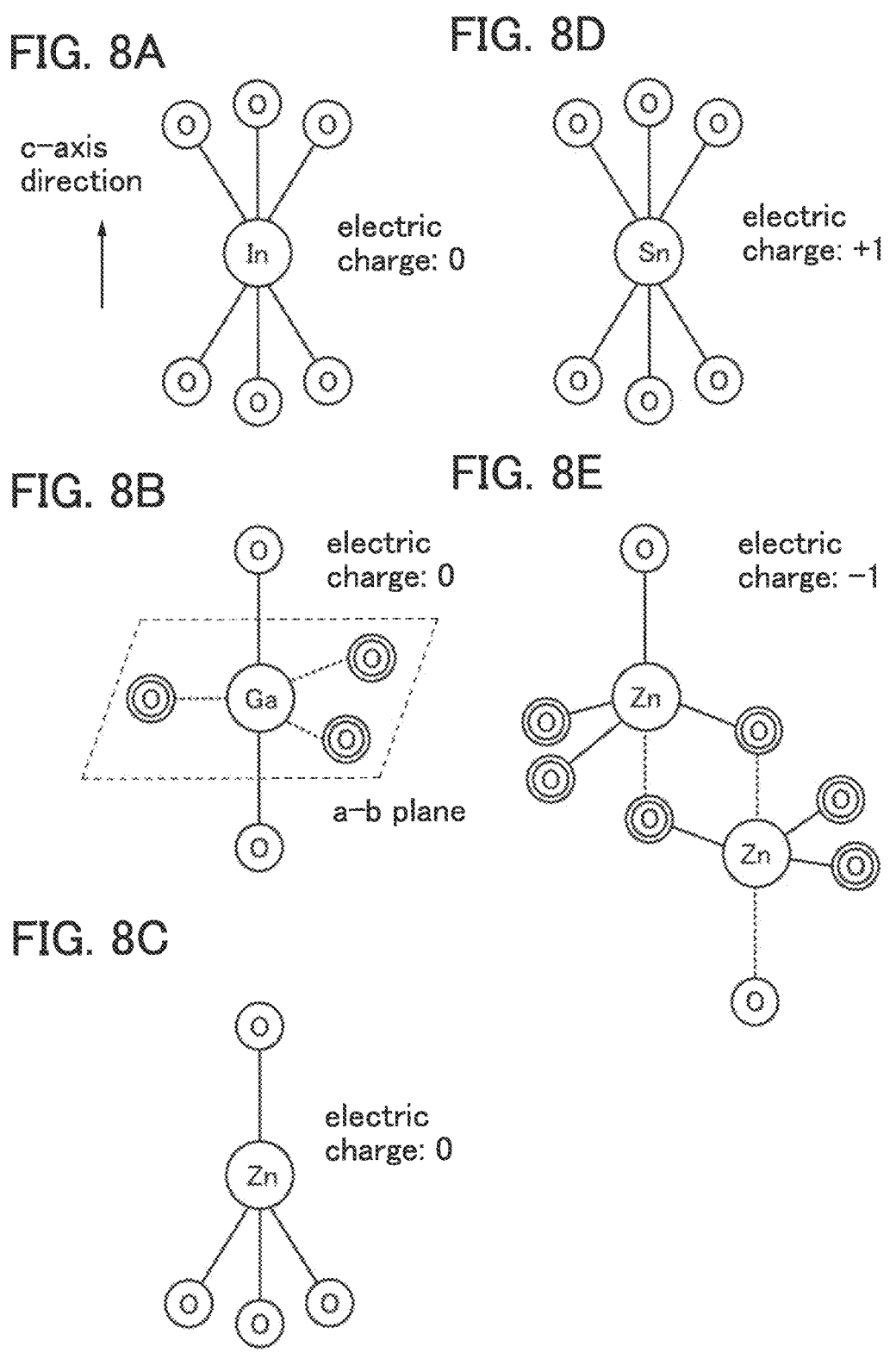

FIG. 8A illustrates a structure including one hexacoordinate indium (hexacoordinate In) atom and six tetracoordinate oxygen (tetracoordinate O) atoms proximate to the hexacoordinate In atom. Note that a structure including one metal atom such as an In atom and oxygen atoms proximate to the metal atom is referred to as a small group. In FIG. 8A, an octahedral structure is illustrated as a planar structure for convenience. Three tetracoordinate O atoms exist in each of the upper and lower halves in FIG. 8A. The electric charge of the small group in FIG. 8A is 0.

FIG. 8B illustrates a structure including one pentacoordinate Ga atom, three tricoordinate oxygen (tricoordinate O) atoms proximate to the pentacoordinate Ga atom, and two tetracoordinate O atoms proximate to the pentacoordinate Ga atom. All the three tricoordinate O atoms exist on the a-b plane. In FIG. 8B, the tetracoordinate O atom exists in each of the upper and lower halves. Since there is a pentacoordinate indium (pentacoordinate In) atom as well as a hexacoordinate In atom, the structure in FIG. 8B can be composed of a pentacoordinate In atom, three tricoordinate O atoms, and two tetracoordinate O atoms. The electric charge of the small group in FIG. 8B is 0.

FIG. 8C illustrates a structure including one tetracoordinate zinc (tetracoordinate Zn) atom and four tetracoordinate O atoms proximate to the tetracoordinate Zn atom. In FIG. 8C, one tetracoordinate O atom exists in the upper half and three tetracoordinate O atoms exist in the lower half. The electric charge of the small group in FIG. 8C is 0.

FIG. 8D illustrates a structure including one hexacoordinate tin (hexacoordinate Sn) atom and six tetracoordinate O atoms proximate to the hexacoordinate Sn atom. In FIG. 8D, three tetracoordinate O atoms exist in each of the upper and lower halves. The electric charge of the small group in FIG. 8D is +1.

FIG. 8E illustrates a small group including two zinc atoms. In FIG. 8E, one tetracoordinate O atom exists in each of the upper and lower halves. The electric charge of the small group in FIG. 8E is −1.

Note that a plurality of small groups form a medium group, and a plurality of medium groups form a large group (also referred to as unit cell).

A rule of bonding between the small groups is described below. For example, three tetracoordinate O atoms in the upper half with respect to a hexacoordinate In atom are each bonded to three proximate hexacoordinate In atoms therebelow, and three tetracoordinate O atoms in the lower half are each bonded to three proximate hexacoordinate In atoms thereabove. One tricoordinate O atom in the upper half with respect to a pentacoordinate Ga atom is bonded to one proximate pentacoordinate Ga atom therebelow, and one tricoordinate O atom in the lower half is bonded to one proximate pentacoordinate Ga atom thereabove. Moreover, one tetracoordinate O atom in the upper half with respect to a tetracoordinate Zn atom is bonded to one proximate tetracoordinate Zn atom therebelow, and three tetracoordinate O atoms in the lower half are each bonded to three proximate tetracoordinate Zn atoms thereabove. In this manner, the number of tetracoordinate O atoms above a metal atom is equal to the number of proximate metal atoms below each tetracoordinate O atom. Similarly, the number of tetracoordinate O atoms below a metal atom is equal to the number of proximate metal atoms above each tetracoordinate O atom. Here, since the coordination number of the tetracoordinate O atom is 4, the total number of proximate metal atoms below and above the O atom is 4. Accordingly, when the sum of the number of tetracoordinate O atoms above a metal atom and the number of tetracoordinate O atoms below another metal atom is 4, two kinds of small groups including the metal atoms can be bonded to each other. For example, in the case where a hexacoordinate metal (In or Sn) atom is bonded through three tetracoordinate O atoms in the lower half, it is bonded to a pentacoordinate metal atom or a tetracoordinate metal atom.

A metal atom whose coordination number is 4, 5, or 6 is bonded to another metal atom through a tetracoordinate O atom in the c-axis direction. In addition, a medium group can be formed by combining a plurality of small groups so that the total electric charge of the layered structure is 0.

Figures 9A, 9B, 9C:
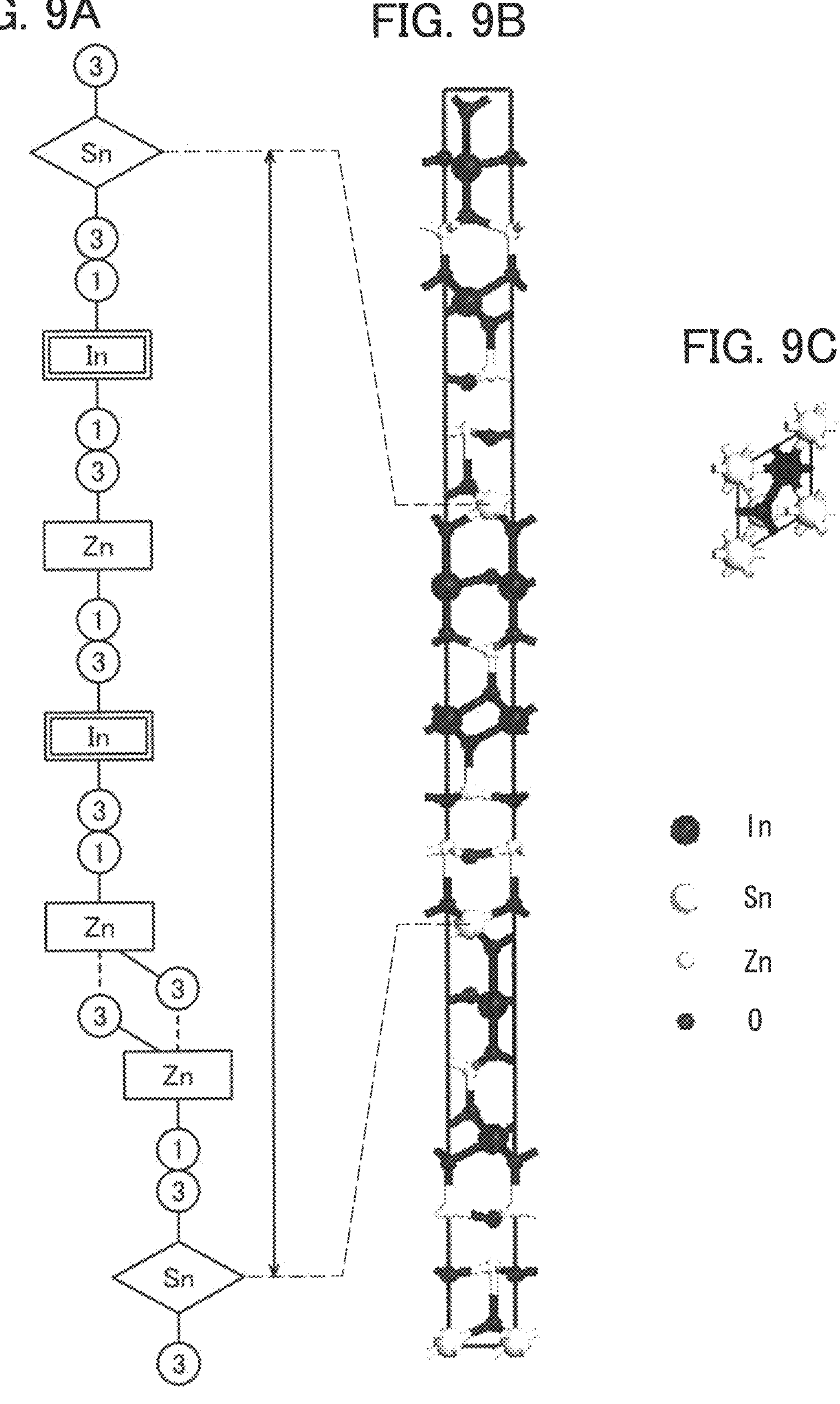
FIGS. 9A to 9C illustrate an example of a CAAC.

FIG. 9A illustrates a model of a medium group included in a layered structure of an In—Sn—Zn-based material. FIG. 9B illustrates a large group including three medium groups. FIG. 9C illustrates an atomic arrangement where the layered structure shown in FIG. 9B is observed from the c-axis direction.

Note that in FIG. 9A, for convenience, a tricoordinate O atom is omitted and only the number of tetracoordinate O atoms is shown in a circle; for example, three tetracoordinate O atoms existing in each of the upper and lower halves with respect to a Sn atom are denoted by circled 3. Similarly, in FIG. 9A, one tetracoordinate O atom existing in each of the upper and lower halves with respect to an In atom is denoted by circled 1. FIG. 9A also shows a Zn atom proximate to one tetracoordinate O atom in the lower half and three tetracoordinate O atoms in the upper half, and a Zn atom proximate to one tetracoordinate O atom in the upper half and three tetracoordinate O atoms in the lower half.

The medium group included in the layered structure of the In—Sn—Zn-based material in FIG. 9A has the following structure. In the order starting from the top, a Sn atom proximate to three tetracoordinate O atoms in each of the upper and lower halves is bonded to an In atom proximate to one tetracoordinate O atom in each of the upper and lower halves. The In atom is bonded to a Zn atom proximate to three tetracoordinate O atoms in the upper half. The Zn atom is bonded to an In atom proximate to three tetracoordinate O atoms in each of the upper and lower halves through one tetracoordinate O atom in the lower half. The In atom is bonded to a small group that includes two Zn atoms and is proximate to one tetracoordinate O atom in the upper half. The small group is bonded to a Sn atom proximate to three tetracoordinate O atoms in each of the upper and lower halves through one tetracoordinate O atom in the lower half of the small group. A plurality of the medium groups are bonded to form a large group.

Here, electric charge for one bond of a tricoordinate O atom and electric charge for one bond of a tetracoordinate O atom can be assumed to be −0.667 and −0.5, respectively. For example, electric charge of a (hexacoordinate or pentacoordinate) In atom, electric charge of a (tetracoordinate) Zn atom, and electric charge of a (pentacoordinate or hexacoordinate) Sn atom are +3, +2, and +4, respectively. Accordingly, electric charge in a small group including a Sn atom is +1. Therefore, electric charge of −1, by which the electric charge of +1 is canceled, is needed to form a layered structure including a Sn atom. As a structure having electric charge of −1, the small group including two Zn atoms as illustrated in FIG. 8E can be given. For example, with one small group including two Zn atoms, electric charge of one small group including a Sn atom can be cancelled, so that the total electric charge of the layered structure can be 0.

Further, an In—Sn—Zn-based crystal ($In_2SnZn_3O_8$) can be obtained with a structure in which the large group in FIG. 9B is repeated. The layered structure of the In—Sn—Zn-based crystal can be expressed by a composition formula, $In_2SnZn_2O_7(ZnO)_m$ (m is 0 or a natural number).

The same can be said for the case of using the other four-component metal oxides, three-component metal oxides, and two-component metal oxides shown in this embodiment and other metal oxides.

Figures 10A, 10B, 10C:
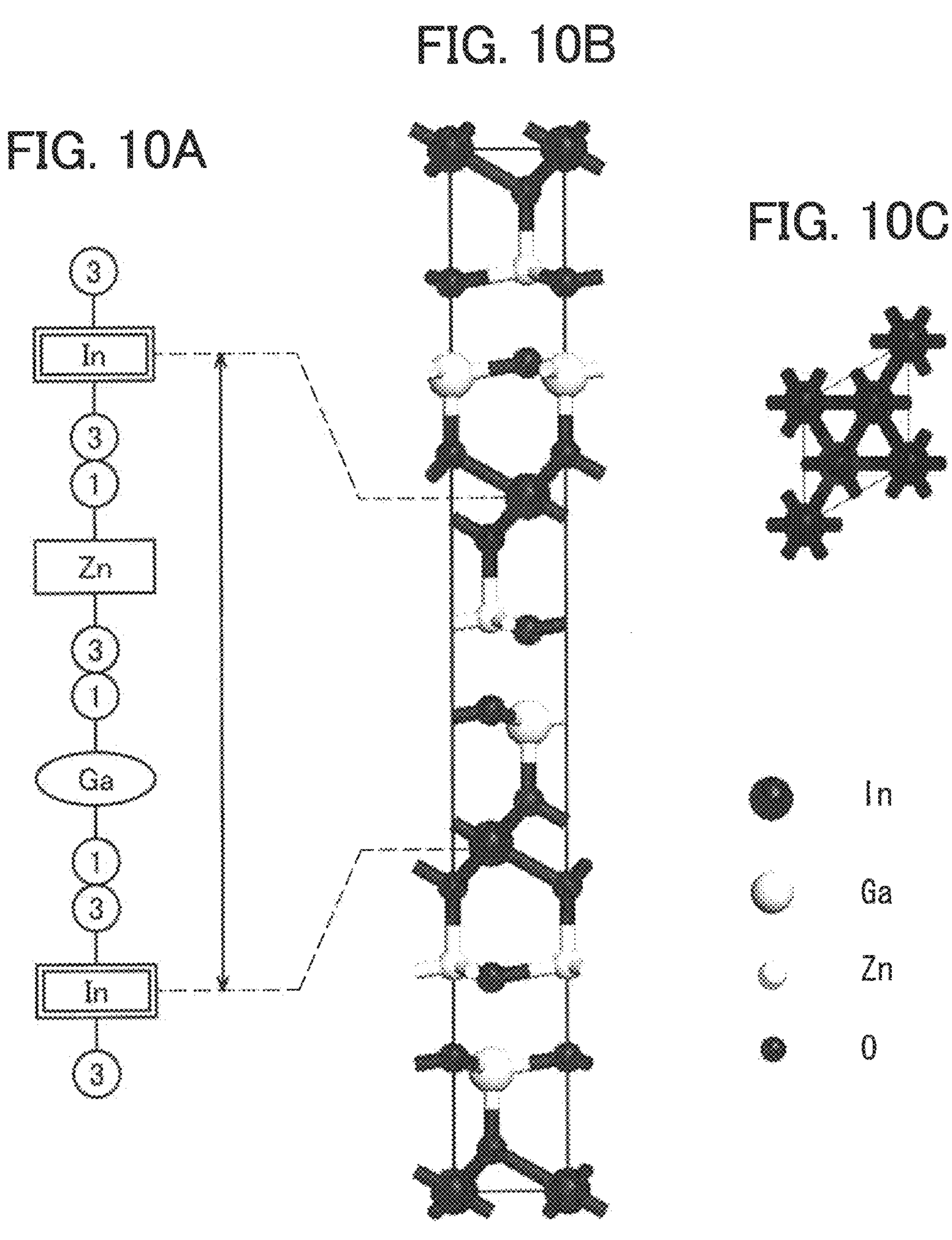
FIGS. 10A to 10C illustrate an example of a CAAC.

As an example, FIG. 10A illustrates a model of a medium group included in a layered structure of an In—Ga—Zn-based material.

The medium group included in the layered structure of the In—Ga—Zn-based material in FIG. 10A has the following structure. In the order starting from the top, an In atom proximate to three tetracoordinate O atoms in each of the upper and lower halves is bonded to a Zn atom proximate to one tetracoordinate O atom in the upper half. The Zn atom is bonded to a Ga atom proximate to one tetracoordinate O atom in each of the upper and lower halves through three tetracoordinate O atoms in the lower half with respect to the Zn atom. The Ga atom is bonded to an In atom proximate to three tetracoordinate O atoms in each of the upper and lower halves through one tetracoordinate O atom in the lower half with respect to the Ga atom. A plurality of the medium groups are bonded to form a large group.

FIG. 10B illustrates a large group including three medium groups. FIG. 10C illustrates an atomic arrangement where the layered structure shown in FIG. 10B is observed from the c-axis direction.

Here, since electric charge of a (hexacoordinate or pentacoordinate) In atom, electric charge of a (tetracoordinate) Zn atom, and electric charge of a (pentacoordinate) Ga atom are +3, +2, and +3, respectively, electric charge of a small group including any of the In atom, the Zn atom, and the Ga atom is 0. As a result, the total electric charge of a medium group having a combination of these small groups is always 0.

In order to form the layered structure of the In—Ga—Zn-based material, a large group can be formed using not only the medium group in FIG. 10A but also a medium group in which the arrangement of the In atom, the Ga atom, and the Zn atom is different from that in FIG. 10A.

Specifically, when the large group illustrated in FIG. 10B is repeated, an In—Ga—Zn-based crystal can be obtained. Note that a layered structure of the In—Ga—Zn-based crystal can be expressed as a composition formula, $InGaO_3(ZnO)_n$ (n is a natural number).

Figure 26A:
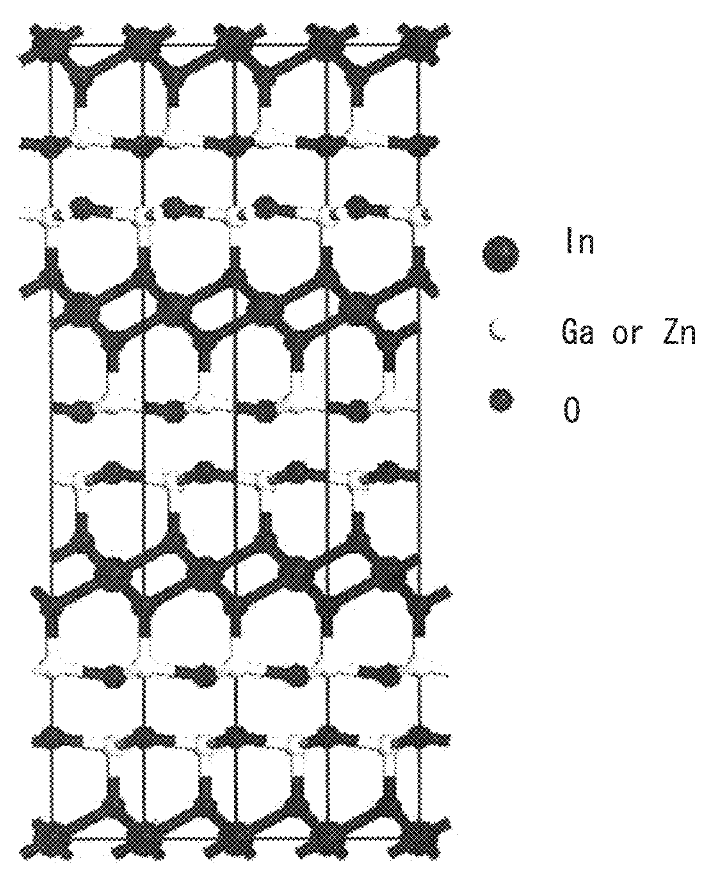
FIGS. 26A and 26B each illustrate an example of a CAAC.

In the case of n=1 ($InGaZnO_4$), a crystal structure illustrated in FIG. 26A can be obtained, for example. Note that in the crystal structure in FIG. 26A, Ga can be replaced with In because a Ga atom and an In atom each have five ligands as described with reference to FIG. 8B.

Figure 26B:
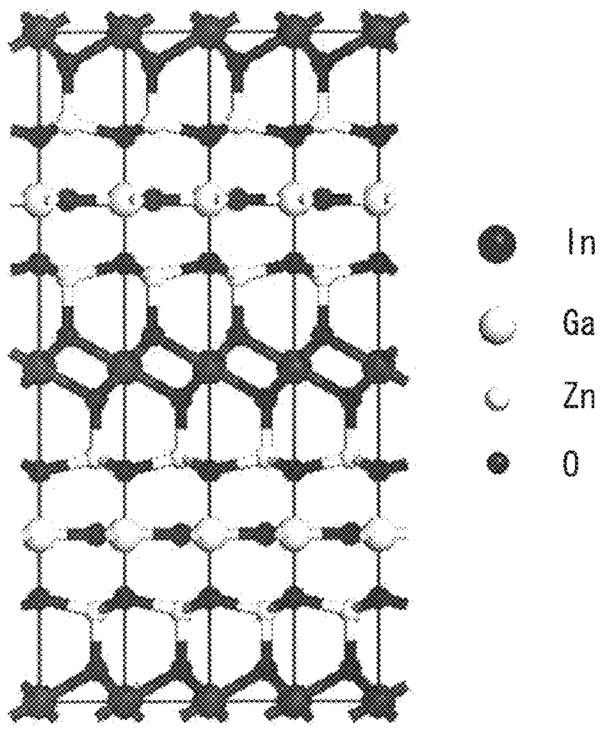

In the case of n=2 ($InGaZn_2O_5$), a crystal structure illustrated in FIG. 26B can be obtained, for example. Note that in the crystal structure in FIG. 26B, Ga can be replaced with In because a Ga atom and an In atom each have five ligands as described with reference to FIG. 8B.

The above is the examples of the structure of the CAAC-OS. An oxide semiconductor with crystallinity, such as the CAAC-OS, has few defects in the bulk.

The regions 604_a_a_, 604_b_a_, 604_a_b_, and 604_b_b_ illustrated in FIGS. 7A and 7B are doped with the dopant and function as a source and a drain of the transistor. As the dopant, at least one of elements of Group 13 in the periodic table (e.g., boron), elements of Group 15 in the periodic table (e.g., one or more of nitrogen, phosphorus, and arsenic), and rare gas elements (e.g., one or more of helium, argon, and xenon) can be used, for example. A region functioning as a source of the transistor can be called a source region, and a region functioning as a drain of the transistor can be called a drain region. Addition of the dopant to the regions 604_a_a_, 604_b_a_, 604_a_b_, and 604_b_b_ can reduce the resistance between the regions and the conductive layers; thus, the transistor can be downsized.

The conductive layers 605_a_a_, 605_b_a_, 605_a_b_, and 605_b_b_ function as the source or the drain of the transistor. Note that a layer functioning as a source of the transistor can be called a source electrode or a source wiring, and a layer functioning as a drain of the transistor can be called a drain electrode or a drain wiring.

The conductive layers 605_a_a_, 605_b_a_, 605_a_b_, and 605_b_b_ can be formed using, for example, a layer of a metal material such as aluminum, magnesium, chromium, copper, tantalum, titanium, molybdenum, or tungsten or an alloy material containing any of the above metal materials as a main component. For example, the conductive layers 605a_a, 605b_a, 605a_b, and 605b_b can be formed using a layer of an alloy material containing copper, magnesium, and aluminum. Moreover, the conductive layers 605a_a, 605b_a, 605a_b, and 605b_b can be a stack of materials applicable to these conductive layers. For example, the conductive layers 605a_a, 605b_a, 605a_b, and 605b_b can be formed using a stack including a layer of an alloy material containing copper, magnesium, and aluminum and a layer containing copper.

Alternatively, the conductive layers 605a_a, 605b_a, 605a_b, and 605b_b can be a layer containing a conductive metal oxide. Examples of the conductive metal oxide are indium oxide, tin oxide, zinc oxide, indium oxide-tin oxide, and indium oxide-zinc oxide. Note that silicon oxide may be contained in the conductive metal oxide applicable to the conductive layers 605a_a, 605b_a, 605a_b, and 605b_b.

As the insulating layers 606a and 606b, a layer of a material applicable to the insulating layers 602_a and 602_b can be used, for example. Alternatively, the insulating layers 606a and 606b can be formed using a stack of materials applicable to the insulating layers 606a and 606b.

The insulating layer 607 functions as a protective insulating layer for preventing impurities from entering the transistor.

As the insulating layer 607, a layer of a material applicable to the insulating layers 602_a and 602_b can be used, for example. Alternatively, the insulating layer 607 can be formed using a stack of materials applicable to the insulating layer 607. For example, insulating layer 607 may be formed using a silicon oxide layer, an aluminum oxide layer, or the like. For example, the use of an aluminum oxide layer as the insulating layer 607 can more effectively prevent impurities from entering the semiconductor layer 603_b and effectively prevent the semiconductor layer 603_b from releasing oxygen.

Note that the transistor in this embodiment may have a structure in which an insulating layer is provided over part of the oxide semiconductor layer serving as a channel formation layer and a conductive layer serving as a source or a drain is provided to overlap with the oxide semiconductor layer with the insulating layer placed therebetween. In that case, the insulating layer functions as a layer protecting the channel formation layer of the transistor (also referred to as channel protective layer). As the insulating layer functioning as a channel protective layer, a layer containing a material applicable to the insulating layers 602_a and 602_b can be used, for example. Alternatively, the insulating layer functioning as a channel protective layer may be a stack of materials applicable to the insulating layers 602_a and 602_b.

Further, base layers may be formed over the element formation layers 600_a and 600_b and the transistors may be formed over the base layers. In that case, the base layer can be a layer of a material applicable to the insulating layers 602_a and 602_b, for example. Alternatively, the base layer may be a stack of materials applicable to the insulating layers 602_a and 602_b. For example, a stack of an aluminum oxide layer and a silicon oxide layer used as the base layer can prevent oxygen in the base layer from being released through the semiconductor layers 603_a and 603_b.

Next, as an example of a method for manufacturing the transistor in this embodiment, an example of a method for manufacturing the transistor in FIG. 7A will be described with reference to FIGS. 11A to 11E. FIGS. 11A to 11E are schematic cross-sectional views illustrating a method for manufacturing the transistor in FIG. 7A.

Figure 11A:
FIGS. 11A to 11E illustrate an example of a method for manufacturing a semiconductor device.

First, as illustrated in FIG. 11A, the element formation layer 600_a is prepared, and the semiconductor layer 603_a is formed over the element formation layer 600_a.

For example, a film of an oxide semiconductor material applicable to the semiconductor layer 603_a (such a film is also referred to as an oxide semiconductor film) is formed by sputtering, thereby forming the semiconductor layer 603_a. Note that the oxide semiconductor film may be partly etched after the deposition. Moreover, the oxide semiconductor film may be formed in a rare gas atmosphere, an oxygen atmosphere, or a mixed atmosphere of a rare gas and oxygen.

The oxide semiconductor film can be formed using an oxide target having a composition ratio of $In_2O_3$:$Ga_2O_3$:ZnO=1:1:1 (in a molar ratio) as a sputtering target.

Alternatively, the oxide semiconductor film may be formed using an oxide target having a composition ratio of $In_2O_3$:$Ga_2O_3$:ZnO=1:1:2, 4:2:3, 3:1:2, 2:1:3, or 3:1:4 (in a molar ratio), for example.

In addition, the oxide semiconductor film may be formed using, as the sputtering target, an oxide target having a composition ratio of In:Sn:Zn=1:2:2, 2:1:3, 1:1:1, or 20:45:35 (in an atomic ratio). With the use of the oxide target having any of the above composition ratios, an oxide semiconductor film with high crystallinity can be formed. Specifically, an oxide semiconductor film with higher crystallinity can be formed by using an oxide target having a composition ratio of In:Sn:Zn=2:1:3.

Furthermore, an In—Zn-based oxide film may be formed using, as the sputtering target, an oxide target having a composition ratio of In:Zn=50:1 to 1:2 ($In_2O_3$:ZnO=25:1 to 1:4 in a molar ratio), preferably In:Zn=20:1 to 1:1 ($In_2O_3$:ZnO=10:1 to 1:2 in a molar ratio), further preferably In:Zn=15:1 to 1.5:1 ($In_2O_3$:ZnO=15:2 to 3:4 in a molar ratio). For example, when the atomic ratio of the target used for forming the In—Zn-based oxide semiconductor film is expressed by In:Zn:O=S:U:R, $R>1.5S+U$ is satisfied. The increase in In content makes the field-effect mobility (also simply referred to as mobility) of the transistor higher.

In the case of using a sputtering method, the semiconductor layer 603_a is formed in a rare gas (typically argon) atmosphere, an oxygen atmosphere, or a mixed atmosphere of a rare gas and oxygen, for example. In that case, when the semiconductor layer 603_a is formed in a mixed atmosphere of a rare gas and oxygen, the oxygen content is preferably higher than the rare gas content.

When the film is formed by sputtering, it is preferable to sufficiently suppress leakage from the outside of a deposition chamber and degasification through an inner wall of the deposition chamber so that impurities such as hydrogen, water, a hydroxyl group, or hydride (also referred to as hydrogen compound) are not included in a deposited film.

For example, before the film is formed by sputtering, preheat treatment may be performed in a preheating chamber of a sputtering apparatus. By the preheat treatment, the above impurities can be eliminated.

Before the film is formed by sputtering, for example, it is possible to perform treatment by which voltage is applied to a substrate side, not to a target side, in an argon, nitrogen, helium, or oxygen atmosphere with the use of an RF power source and plasma is generated so that a surface of the substrate on which the film is to be formed is modified (such treatment is also referred to as reverse sputtering). With reverse sputtering, powdery substances (also referred to as particles or dust) attached to the surface where the film is to be formed can be removed.

In the case where the film is formed by sputtering, moisture remaining in the deposition chamber for forming the film can be removed by an entrapment vacuum pump or the like. As the entrapment vacuum pump, a cryopump, an ion pump, or a titanium sublimation pump can be used, for example. Alternatively, moisture remaining in the deposition chamber can be removed by a turbo molecular pump provided with a cold trap. With the use of the vacuum pump, back flow of the exhaust including the impurities can be reduced.

When a high-purity gas from which the above impurities are removed is used as a sputtering gas, for example, the impurity concentration of the deposited film can be lowered. For instance, a gas with a dew point of −70° C. or lower is preferably used as a sputtering gas.

In the example of the method for manufacturing the transistor in this embodiment, a layer is formed by etching part of a film in the following manner, for instance: a resist mask is formed over part of the film by a photolithography process and the film is etched using the resist mask, thereby forming the layer. Note that in this case, the resist mask is removed after the layer is formed.

When an oxide semiconductor layer containing the CAAC is formed as the semiconductor layer 603_*a*, the oxide semiconductor film is formed by sputtering while the temperature of the element formation layer where the oxide semiconductor film is formed ranges from 100° C. to 500° C., preferably from 200° C. to 350° C. The oxide semiconductor film is deposited while the temperature of the element formation layer is high, whereby the field-effect mobility of the transistor to be manufactured can be increased and the gate-bias stress stability can be increased.

In that case, the element formation layer 600_*a* is preferably flat. For example, the average surface roughness of the element formation layer 600_*a* is preferably 1 nm or less, further preferably 0.3 nm or less. By increasing the flatness of the element formation layer 600_*a*, the mobility of the CAAC-OS can be made higher than that of an amorphous oxide semiconductor. For example, the element formation layer 600_*a* can be flattened by at least one of chemical mechanical polishing (CMP) and plasma treatment. Here, plasma treatment includes treatment for performing sputtering on a surface with rare gas ions and treatment for performing etching on a surface with an etching gas.

Figure 11B:
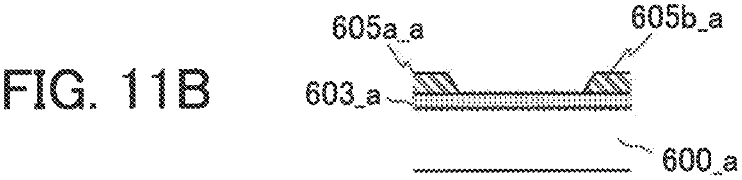

Then, as illustrated in FIG. 11B, the conductive layers 605*a*_*a* and 605*b*_*a* are formed over the semiconductor layer 603_*a*.

For example, a film of a material applicable to the conductive layers 605*a*_*a* and 605*b*_*a* is formed as a first conductive film by sputtering, and the first conductive film is partly etched, thereby forming the conductive layers 605*a*_*a* and 605*b*_*a*.

Figure 11C:
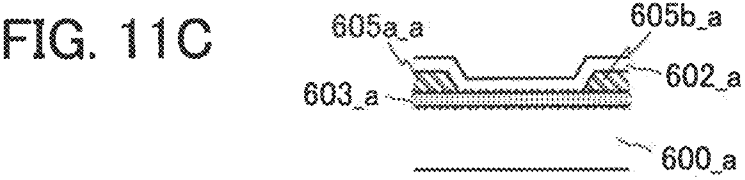
Figure 11D:
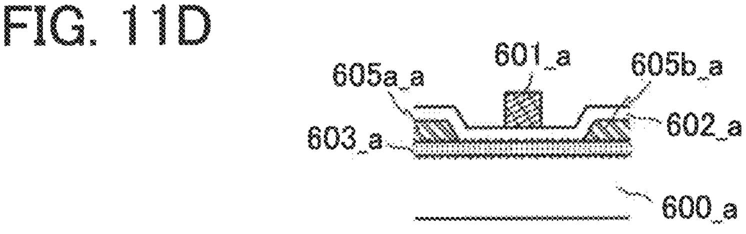

Next, as illustrated in FIG. 11C, the insulating layer 602_*a* is formed in contact with the semiconductor layer 603_*a*.

For example, the insulating layer 602_*a* can be formed by depositing a film applicable to the insulating layer 602_*a* by sputtering in a rare gas (typically argon) atmosphere, an oxygen atmosphere, or a mixed atmosphere of a rare gas and oxygen. The insulating layer 602_*a* formed by sputtering can suppress a reduction in the resistance of a portion of the semiconductor layer 603_*a*, which serves as a back channel of the transistor. The temperature of the element formation layer 600_*a* at the time when the insulating layer 602_*a* is formed preferably ranges from room temperature to 300° C.

Before the formation of the insulating layer 602_*a*, plasma treatment with the use of a gas such as $N_2O$, $N_2$, or Ar may be performed to remove water or the like adsorbed on an exposed surface of the semiconductor layer 603_*a*. In the case where the plasma treatment is performed, the insulating layer 602_*a* is preferably formed after the plasma treatment without exposure to air.

Next, the conductive layer 601_*a* is formed over the insulating layer 602_*a*.

For example, a film of a material applicable to the conductive layer 601_*a* is formed as a second conductive film by sputtering, and the second conductive film is partly etched, thereby forming the conductive layer 601_*a*.

Further, in the example of the method for manufacturing the transistor in FIG. 7A, heat treatment is performed, for example, at higher than or equal to 600° C. and lower than or equal to 750° C., or higher than or equal to 600° C. and lower than the strain point of the substrate. For example, the heat treatment is performed after the oxide semiconductor film is formed, after the oxide semiconductor film is partly etched, after the first conductive film is formed, after the first conductive film is partly etched, after the insulating layer 602_*a* is formed, after the second conductive film is formed, or after the second conductive film is partly etched. The heat treatment eliminates impurities such as hydrogen, water, a hydroxyl group, or hydride from the semiconductor layer 603_*a*.

Note that a heat treatment apparatus for the heat treatment can be an electric furnace or an apparatus for heating an object by heat conduction or heat radiation from a heater such as a resistance heater. For example, a rapid thermal annealing (RTA) apparatus such as a gas rapid thermal annealing (GRTA) apparatus or a lamp rapid thermal annealing (LRTA) apparatus can be used. An LRTA apparatus is an apparatus for heating an object by radiation of light (an electromagnetic wave) emitted from a lamp such as a halogen lamp, a metal halide lamp, a xenon arc lamp, a carbon arc lamp, a high-pressure sodium lamp, or a high-pressure mercury lamp. A GRTA apparatus is an apparatus for heat treatment using a high-temperature gas. As the high-temperature gas, a rare gas or an inert gas (e.g., nitrogen) which does not react with the object by the heat treatment can be used.

Further, after the heat treatment is performed and while the heating temperature is being maintained or being decreased, a high-purity oxygen gas, a high-purity $N_2O$ gas, or ultra-dry air (having a dew point −40° C. or lower, preferably −60° C. or lower) may be introduced in the furnace where the heat treatment has been performed. It is preferable that the oxygen gas or the $N_2O$ gas do not contain water, hydrogen, and the like. The purity of the oxygen gas or the $N_2O$ gas which is introduced into the heat treatment apparatus is preferably 6N or higher, further preferably 7N or higher; that is, the impurity concentration of the oxygen gas or the $N_2O$ gas is preferably 1 ppm or lower, further preferably 0.1 ppm or lower. By the action of the oxygen gas or the $N_2O$ gas, oxygen is supplied to the semiconductor layer 603_*a*, and defects due to oxygen deficiency in the semiconductor layer 603_*a* can be reduced. Note that the high-purity oxygen gas, high-purity $N_2O$ gas, or ultra-dry air may be introduced during the heat treatment.

In the example of the method for manufacturing the transistor in FIG. 7A, oxygen may be implanted into the oxide semiconductor film with a method of accelerating oxygen ions by electric fields, such as oxygen doping using oxygen plasma, after the semiconductor layer 603_*a* is formed, after the conductive layers 605*a*_*a* and 605*b*_*a* are formed, after the insulating layer 602_*a* is formed, after the conductive layer 601_*a* is formed, or after the heat treatment is performed. For example, oxygen doping using a high-density plasma of 2.45 GHz may be performed. Alternatively, oxygen doping may be performed by an ion implantation method. The oxygen doping can reduce variations in electrical characteristics of transistors to be manufactured. For example, the oxygen doping is performed so that the insulating layer 602_*a* contains oxygen with a higher proportion than that in the stoichiometric composition.

When the insulating layer in contact with the semiconductor layer 603_*a* contains an excessive amount of oxygen, oxygen is easily supplied to the semiconductor layer 603_*a*. Thus, oxygen defects in the semiconductor layer 603_*a* or at the interface between the insulating layer 602_*a* and the semiconductor layer 603_*a* can be reduced, which results in further reduction in the carrier concentration of the semiconductor layer 603_*a*. This embodiment is not limited to the above; even if an excessive amount of oxygen is contained in the semiconductor layer 603_*a* through the fabrication process, the insulating layer in contact with the semiconductor layer 603_*a* can prevent oxygen from being released from the semiconductor layer 603_*a*.

For example, when an insulating layer containing gallium oxide is formed as the insulating layer 602_*a*, the composition of gallium oxide can be set to be $Ga_2O_x$ by supplying the insulating layer with oxygen.

When an insulating layer containing aluminum oxide is formed as the insulating layer 602_*a*, the composition of aluminum oxide can be set to be $Al_2O_x$ by supplying the insulating layer with oxygen.

Further, when an insulating layer containing gallium aluminum oxide or aluminum gallium oxide is formed as the insulating layer 602_*a*, the composition of gallium aluminum oxide or aluminum gallium oxide can be set to be $Ga_xAl_{2-x}O_{3+\alpha}$ by supplying the insulating layer with oxygen.

Through the above steps, impurities such as hydrogen, water, a hydroxyl group, or hydride (a hydrogen compound) are removed from the semiconductor layer 603_*a* and oxygen is supplied to the semiconductor layer 603_*a*; thus, the oxide semiconductor layer can be highly purified.

In addition to the heat treatment, after the insulating layer 602_*a* is formed, heat treatment (preferably at 200° C. to 600° C., for example, at 250° C. to 350° C.) may be performed in an inert gas atmosphere or an oxygen gas atmosphere.

The intended heating temperature of the element formation layer 600_*a* or the temperature of the heat treatment after the deposition of the oxide semiconductor film is 150° C. or higher, preferably 200° C. or higher, further preferably 400° C. or higher. When the heat treatment after the oxide semiconductor film is deposited is performed at 300° C. or higher, impurities such as hydrogen contained in the film can be released and removed (the film can be dehydrated or dehydrogenated).

The heat treatment can be performed in an oxygen atmosphere; alternatively, the following two steps may be performed: dehydration or dehydrogenation is performed under a nitrogen atmosphere or a reduced pressure and then thermal treatment is performed in an oxygen atmosphere. By performing thermal treatment in an atmosphere including oxygen after the dehydration or dehydrogenation, oxygen can be added to the oxide semiconductor, so that the effect of the heat treatment can be further enhanced. Moreover, as the treatment for supplying oxygen, thermal treatment may be performed while the insulating layer is placed in contact with the oxide semiconductor layer. A defect due to oxygen deficiency is easily caused in the oxide semiconductor layer or at the interface between the oxide semiconductor layer and a layer stacked over the oxide semiconductor layer, for example; however, when excess oxygen is included in the oxide semiconductor by the heat treatment, oxygen deficiency caused constantly can be compensated for by excess oxygen. The excess oxygen is mainly oxygen existing between lattices. By setting the concentration of oxygen in the range of $1\times10^{16}/cm^3$ to $2\times10^{20}/cm^3$, oxygen can be included in the oxide semiconductor layer without causing crystal distortion or the like even if the oxide semiconductor layer is crystallized, for example. The heat treatment performed after the formation of the oxide semiconductor film can increase the gate-bias stress stability of the transistor to be manufactured, and can increase the field-effect mobility of the transistor.

Figure 11E:
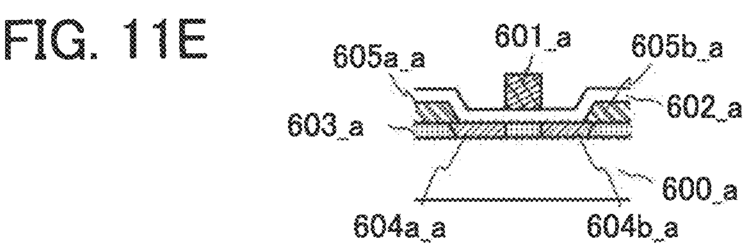

Then, as illustrated in FIG. 11E, a dopant is added to the semiconductor layer 603_*a* from a side on which the conductive layer 601_*a* is formed, so that the region 604*a*_*a* and the region 604*b*_*a* are formed in a self-aligned manner through the insulating layer 602_*a*.

For example, the dopant can be added by an ion doping apparatus or an ion implantation apparatus.

Note that the given example of the method for manufacturing the transistor is not necessarily applied only to the transistor in FIG. 7A. For example, the above description of the example of the method for manufacturing the transistor in FIG. 7A can be applied as appropriate to the components in FIG. 7B which have the same designations as the components in FIG. 7A and have a function at least partly the same as that of the components in FIG. 7A.

As described with reference to FIGS. 7A and 7B, FIGS. 8A to 8E, FIGS. 9A to 9C, FIGS. 10A to 10C, and FIGS. 11A to 11E, each example of the transistor in this embodiment includes a conductive layer functioning as a gate; an insulating layer functioning as a gate insulating layer; an oxide semiconductor layer in which a channel is formed and which overlaps with the conductive layer functioning as the gate with the insulating layer functioning as the gate insulating layer placed therebetween; a conductive layer that is electrically connected to the oxide semiconductor layer and functions as one of a source and a drain; and a conductive layer that is electrically connected to the oxide semiconductor layer and functions as the other of the source and the drain.

In the transistor in the example of this embodiment, the carrier concentration of the oxide semiconductor layer can be lower than $1\times10^{14}/cm^3$, preferably lower than $1\times10^{12}/cm^3$, further preferably lower than $1\times10^{11}/cm^3$.

The carrier density of an oxide semiconductor applied to the transistor is preferably $1\times10^{18}/cm^3$ or lower. An oxide semiconductor containing In or Zn can have a carrier density of $1\times10^{18}/cm^3$ or lower by performing high purification of the oxide semiconductor film (removal of hydrogen and the like) or heat treatment after the deposition as described above, as well as by containing Ga or Sn as its component.

By performing at least one of the heat treatment during the deposition of the oxide semiconductor film and the heat treatment after the deposition, the threshold voltage of the transistor can be positively shifted to make the transistor normally off, and the off-state current per micrometer of channel width can be 10 aA ($1\times10^{17}$ A) or less, 1 aA ($1\times10^{-18}$ A) or less, 10 zA ($1\times10^{-20}$ A) or less, 1 zA ($1\times10^{-21}$ A) or less, and even 100 yA ($1\times10^{-22}$ A) or less.

It is preferable that the off-state current of the transistor be as low as possible; the lower limit of the off-state current of the transistor in this embodiment is estimated to be about $10^{-30}$ A/μm.

When the transistor including the oxide semiconductor layer in this embodiment is used as, for example, the transistor in the storage circuit in any of the above embodiments, the data retention time of the storage circuit can be extended.

The transistor in the example of this embodiment and another transistor, for example, a transistor including a semiconductor layer containing a semiconductor belonging to Group 14 of the periodic table (e.g., silicon) can be stacked. Thus, the circuit area can be reduced while the transistor including the oxide semiconductor layer and the another transistor can be formed over one substrate.

As described in Embodiment 1, it is preferable to employ a structure in which a transistor including an oxide semiconductor (corresponding to the transistor 107 in FIG. 1B and the like) is provided over a transistor including single crystal silicon (corresponding to the transistor 111 in FIG. 1B and the like). This structure can achieve all of the following: high-speed operation, data retention, and the reduction in circuit area.

The transistor including the oxide semiconductor can have relatively high field-effect mobility regardless of whether the oxide semiconductor is either amorphous or crystalline. Such an increase in field-effect mobility is presumed to be achieved not only by removal of impurities by dehydration or dehydrogenation but also by a reduction in interatomic distance due to an increase in density. Moreover, the oxide semiconductor film can be crystallized by being purified by removal of impurities from the oxide semiconductor film. For example, the field-effect mobility of a transistor including an In—Sn—Zn-based oxide semiconductor can be higher than 31 $cm^2/V{\cdot}s$, preferably higher than 39 $cm^2/V{\cdot}s$, further preferably higher than 60 $cm^2/V{\cdot}s$. It has been proposed that ideally, a highly purified non-single-crystal oxide semiconductor can achieve a field-effect mobility exceeding 100 $cm^2/V{\cdot}s$. In addition, the example of the transistor in this embodiment indicates that the field-effect mobility thereof is increased as the defect density of the oxide semiconductor layer decreases. The reason therefor will be given below.

The actually measured field-effect mobility of a field-effect transistor, which is not limited to one including an oxide semiconductor layer, is lower than its inherent mobility for a variety of reasons. One of causes for reduction in the field-effect mobility is a defect in a semiconductor layer or a defect at an interface between the semiconductor layer and an insulating layer. For example, with a Levinson model, the field-effect mobility of a transistor based on the assumption that no defect exists inside an oxide semiconductor layer can be calculated theoretically.

Assuming a potential barrier (such as a grain boundary) exists in a semiconductor layer, the measured field-effect mobility of the semiconductor layer, denoted by μ, is expressed by Formula 1 where the inherent field-effect mobility of the semiconductor layer is $\mu_0$.

$$\mu = \mu_0 \exp\left(-\frac{E}{kT}\right) \quad \text{[Formula 1]}$$

In Formula 1, E denotes the height of the potential barrier, k denotes the Boltzmann constant, and T denotes the absolute temperature. Further, on the assumption that the potential barrier is attributed to a defect, E, the height of the potential barrier, can be expressed by Formula 2 according to the Levinson model.

$$E = \frac{e^2 N^2}{8\varepsilon n} = \frac{e^3 N^2 t}{8\varepsilon C_{ox} V_g} \quad \text{[Formula 2]}$$

In Formula 2, e denotes the elementary charge, N denotes the average defect density per unit area in a channel, ε denotes the permittivity of the semiconductor, n denotes the carrier density per unit area in the channel, $C_{ox}$ denotes the capacitance per unit area, $V_g$ denotes the gate voltage, and t denotes the thickness of the channel. In the case where the thickness of the semiconductor layer is less than or equal to 30 nm, the thickness of the channel can be regarded as being the same as the thickness of the semiconductor layer. In addition, the drain current $I_d$ in a linear region is expressed by Formula 3.

$$I_d = \frac{W \mu V_g V_d C_{ox}}{L} \exp\left(-\frac{E}{kT}\right) \quad \text{[Formula 3]}$$

In Formula 3, L denotes the channel length and W denotes the channel width, and L and W are each 10 μm in this example. Moreover, $V_d$ denotes the drain voltage. Both sides of Formula 3 are divided by $V_g$ and then logarithms of both the sides are taken, resulting in Formula 4.

$$\ln\left(\frac{I_d}{V_g}\right) = \ln\left(\frac{W \mu V_d C_{ox}}{L}\right) - \frac{E}{kT} = \ln\left(\frac{W \mu V_d C_{ox}}{L}\right) - \frac{e^3 N^2 t}{8kT\varepsilon C_{ox} V_g} \quad \text{[Formula 4]}$$

The right side of Formula 4 is a function of $V_g$. From Formula 4, it is found that the defect density N can be obtained from a line in a graph that is obtained by plotting actual measured values with In $(I_d/V_g)$ as the ordinate and $1/V_g$ as the abscissa. That is, the defect density can be evaluated from the $I_d$-$V_g$ characteristics of the transistor. For example, the defect density N of an oxide semiconductor film containing indium (In), gallium (Ga), and zinc (Zn) in a 1:1:1 atomic ratio is about $1\times10^{12}/cm^2$.

On the basis of the defect density or the like obtained in the above manner, $\mu_0$, the inherent field-effect mobility of the oxide semiconductor layer, is calculated to be 120 $cm^2/V{\cdot}s$. In general, the measured field-effect mobility of an In—Ga—Zn-based oxide having a defect is about 40 $cm^2/V{\cdot}s$; however, assuming that no defect exists inside the oxide semiconductor and at the interface between the oxide semiconductor and an insulating film, the mobility $\mu_0$ of the oxide semiconductor is expected to be 120 $cm^2/V{\cdot}s$. It is thus found that the mobility of the oxide semiconductor and the field-effect mobility of the transistor are increased as defects are decreased. For example, an oxide semiconductor layer containing the CAAC or the like has low defect density.

Note that even when no defect exists inside the semiconductor layer, scattering at an interface between a channel and a gate insulating layer affects the transport property of the transistor. In other words, the mobility $\mu_1$ at a position that is a distance x away from the interface between the channel and the gate insulator is expressed by Formula 5.

$$\frac{1}{\mu_1} = \frac{1}{\mu_0} + \frac{D}{B}\exp\left(-\frac{x}{l}\right) \quad \text{[Formula 5]}$$

In Formula 5, D denotes the electric field in the gate direction, and B and I are constants. The values of B and I can be obtained from actual measurement results; according to the above measurement results, B is $2.38\times10^7$ cm/s and l is 10 nm (the depth to which the influence of interface scattering reaches). In Formula 5, the second term is increased as D increases (i.e., as the gate voltage increases); accordingly, the mobility $\mu_1$ is decreased as D increases.

Figure 12:
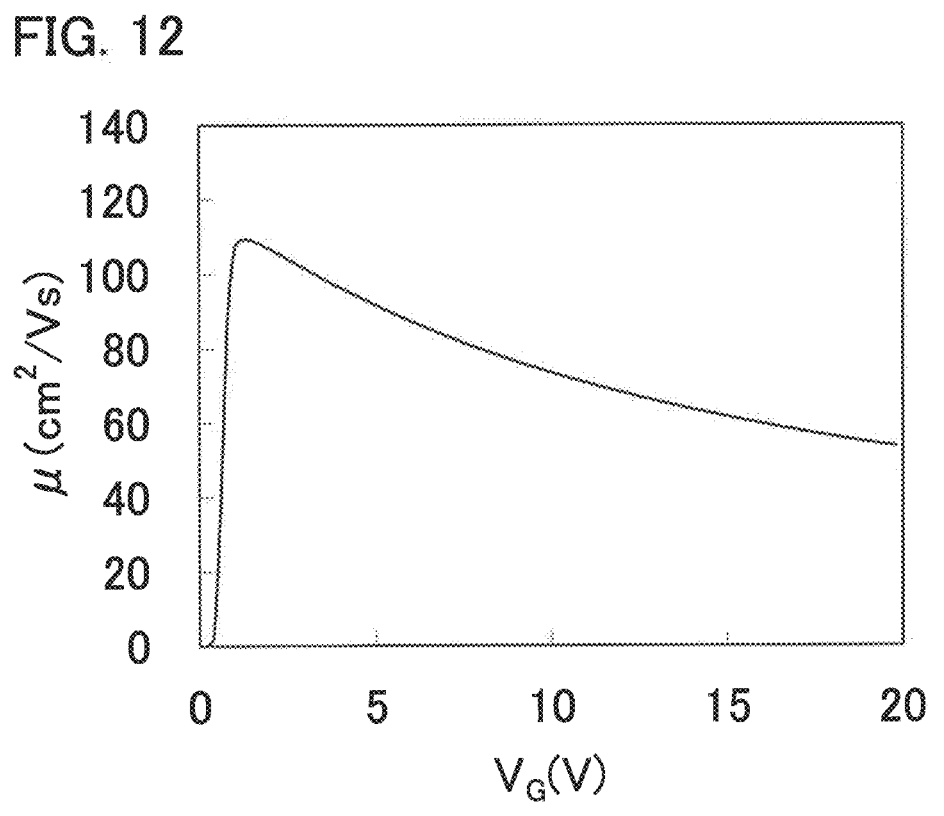

FIG. 12 shows calculation results of the mobility $\mu_2$ of a transistor whose channel is formed in an ideal oxide semiconductor layer with no defect therein. For the calculation, Sentaurus Device, the software manufactured by Synopsys, Inc., is used. For the calculation, the band gap, the electron affinity, the relative permittivity, and the thickness of the oxide semiconductor layer are 2.8 eV, 4.7 eV, 15, and 15 nm, respectively. The work functions of a gate, a source, and a drain of the transistor are 5.5 eV, 4.6 eV, and 4.6 eV, respectively. The thickness of a gate insulating layer is 100 nm, and the relative permittivity thereof is 4.1. The channel length and the channel width of the transistor are each 10 μm, and the drain voltage $V_d$ is 0.1 V.

As shown in FIG. 12, the field-effect mobility is as high as 100 $cm^2$/V·s or more at a gate voltage $V_G$ around 1 V, and decreases as the gate voltage $V_G$ becomes higher because the influence of interface scattering is increased. In order to reduce interface scattering, it is preferable that a surface of the semiconductor layer be flat at the atomic level (i.e., atomic layer flatness).

The following shows the calculation results of electrical characteristics of a minute transistor using an oxide semiconductor having the above-described high field-effect mobility.

Figure 13A:
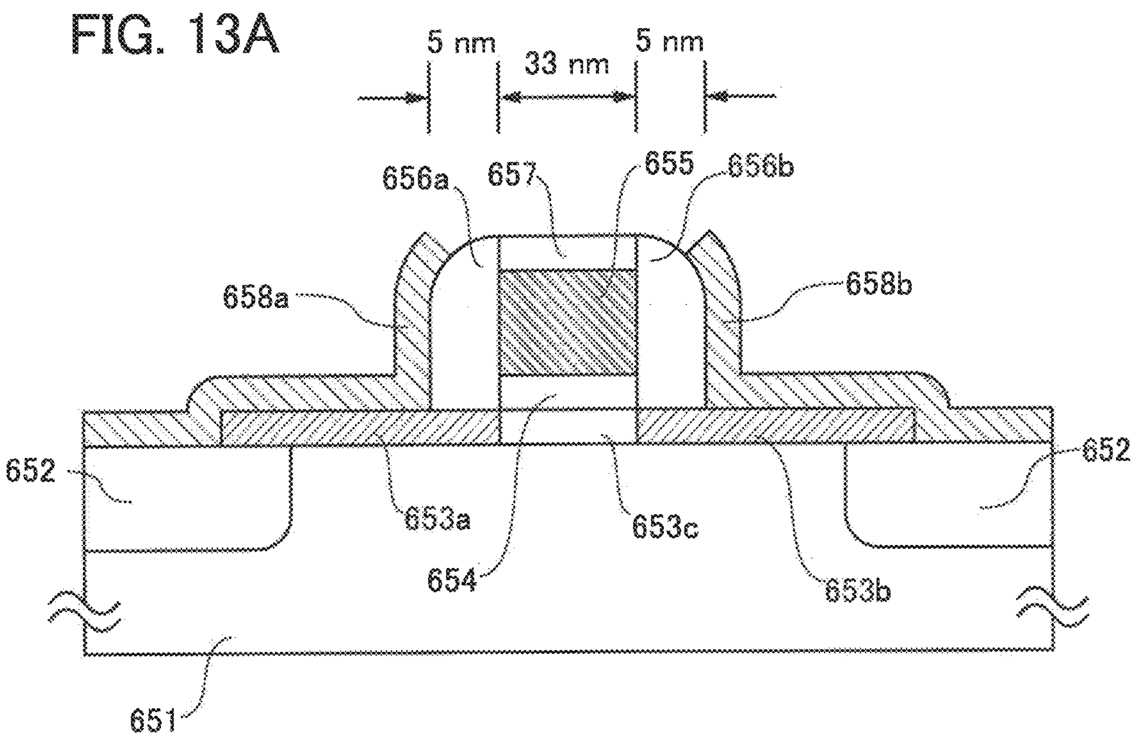
FIGS. 13A and 13B each illustrate an example of a cross-sectional structure of a semiconductor device.
Figure 13B:
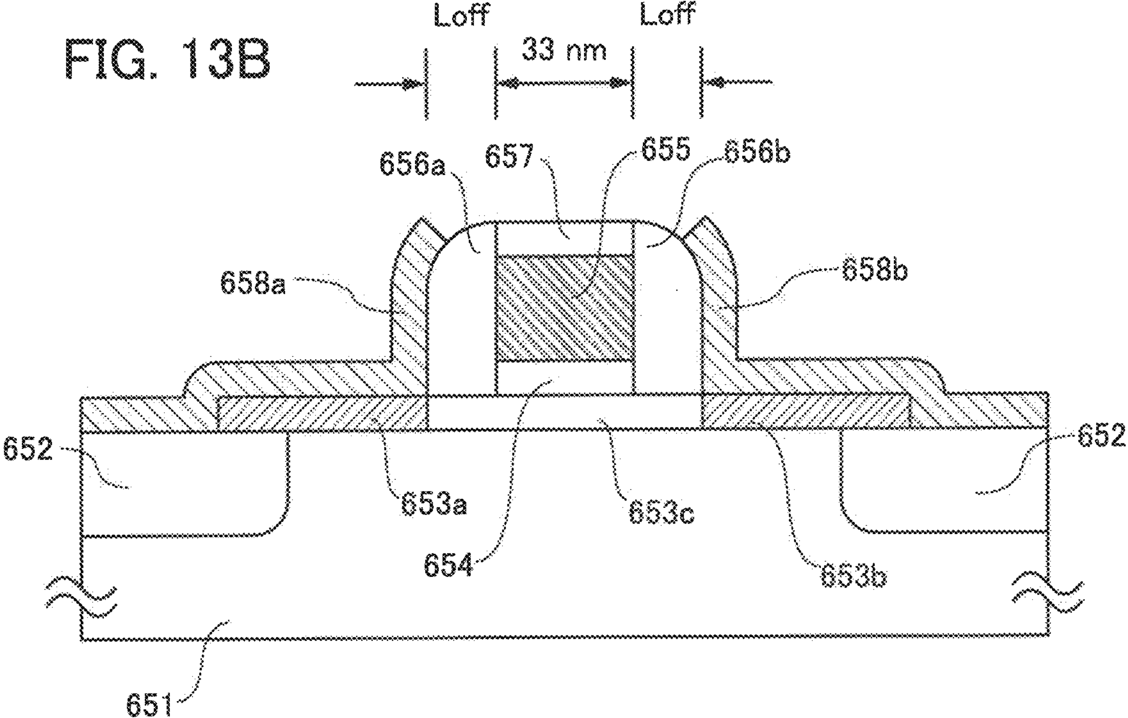

FIGS. 13A and 13B show cross-sectional structures of transistors used for the calculation. The transistors illustrated in FIGS. 13A and 13B each include n-type semiconductor regions 653*a* and 653*b* and a semiconductor region 653*c* in an oxide semiconductor layer. The resistivity of the semiconductor regions 653*a* and 653*b* is $2\times10^{-3}$ Ω·cm.

The transistor in FIG. 13A is provided over a base insulator 651 and a buried insulator 652. The buried insulator 652 is formed using aluminum oxide and provided to be embedded in the base insulator 651.

The transistor in FIG. 13A includes the semiconductor region 653*a*, the semiconductor region 653*b*, the semiconductor region 653*c*, a gate insulating layer 654, a gate electrode 655, a sidewall insulator 656*a*, a sidewall insulator 656*b*, an insulating layer 657, a source electrode 658*a*, and a drain electrode 658*b*.

The semiconductor region 653*c* is positioned between the semiconductor region 653*a* and the semiconductor region 653*b*. The semiconductor region 653*c* is an intrinsic semiconductor region serving as a channel formation region.

The gate electrode 655 is provided over the gate insulating layer 654. The width of the gate electrode 655 is 33 nm.

The sidewall insulators 656*a* and 656*b* are provided in contact with side surfaces of the gate electrode 655. In the transistor in FIG. 13A, a semiconductor region below the sidewall insulator 656*a* is included in the n-type semiconductor region 653*a*, and a semiconductor region below the sidewall insulator 656*b* is included in the n-type semiconductor region 653*b*. The width of the sidewall insulators 656*a* and 656*b* is 5 nm.

The insulating layer 657 is provided over the gate electrode 655. The insulating layer 657 has a function of preventing a short circuit between the gate electrode 655 and a wiring.

The source electrode 658*a* is in contact with the semiconductor region 653*a*.

The drain electrode 658*b* is in contact with the semiconductor region 653*b*.

Note that the channel width of the transistor in FIG. 13A is 40 nm.

The transistor in FIG. 13B differs from the transistor in FIG. 13A in the conductivity type of the semiconductor regions below the sidewall insulators 656*a* and 656*b*. In the transistor in FIG. 13B, the semiconductor regions below the sidewall insulators 656*a* and 656*b* are included in the intrinsic semiconductor region 653*c*. In other words, the transistor in FIG. 13B includes regions where the semiconductor region 653*a* and the gate electrode 655 do not overlap with each other and the semiconductor region 653*c* and the gate electrode 655 do not overlap with each other. These regions are called offset regions, and their width is called offset length ($L_{off}$). In FIG. 13B, the offset length is the same as the width of the sidewall insulators 656*a* and 656*b*.

Note that the other parameters used in calculation are as described above. For the calculation, Sentaurus Device, the software manufactured by Synopsys, Inc., is used.

Figure 14:
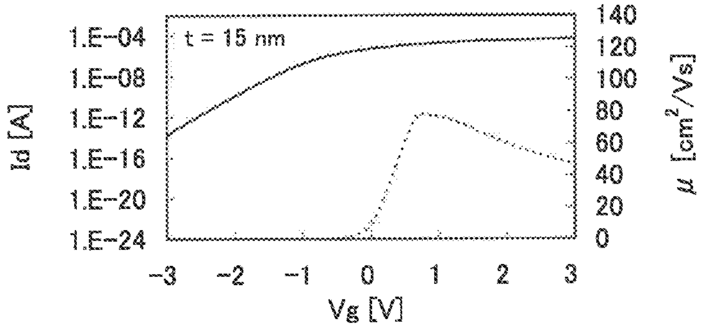
FIGS. 14A to 14C each show a calculation result of electrical characteristics of a semiconductor device.
Figure 14:
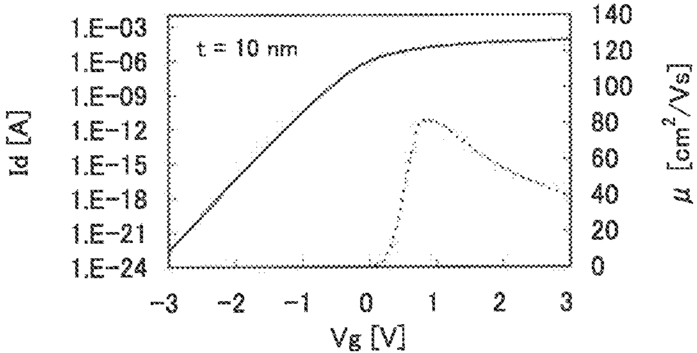
Figure 14:
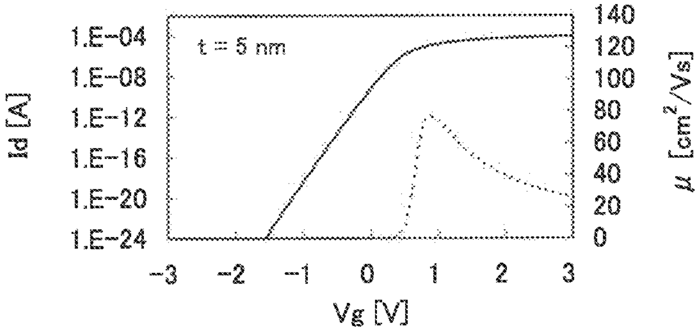

FIGS. 14A to 14C show the gate voltage ($V_g$: a potential difference between the gate and the source) dependence of the drain current ($I_d$, indicated by a solid line) and the mobility (μ, indicted by a dotted line) of the transistor having the structure in FIG. 13A. The drain current $I_d$ is calculated under the assumption that the drain voltage (a potential difference between the drain and the source) is +1 V, and the field-effect mobility μ is calculated under the assumption that the drain voltage is +0.1 V.

FIG. 14A shows the gate voltage dependence of the transistor including the gate insulating layer 654 with a thickness of 15 nm. FIG. 14B shows the gate voltage dependence of the transistor including the gate insulating layer 654 with a thickness of 10 nm. FIG. 14C shows the gate voltage dependence of the transistor including the gate insulating layer 654 with a thickness of 5 nm. As shown in FIGS. 14A to 14C, as the gate insulating layer 654 is thinner, the drain current $I_d$ in the off state (off-state current) in particular is significantly decreased. In contrast, there is no remarkable change in the peak value of the field-effect mobility μ and the drain current $I_d$ in the on state (on-state current). Further, the drain current exceeds 10 μA, which is needed in a storage circuit and the like, at a gate voltage around 1 V.

Figure 15:
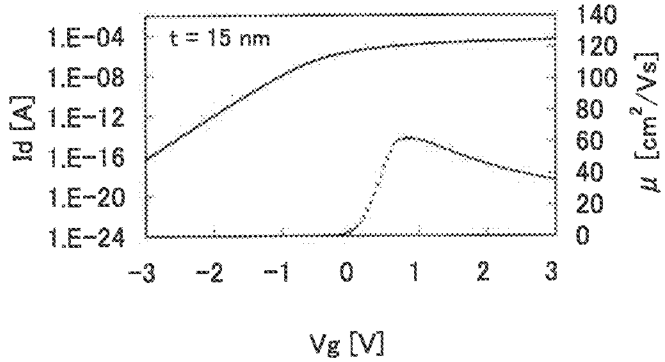
FIGS. 15A to 15C each show a calculation result of electrical characteristics of a semiconductor device.
Figure 15:
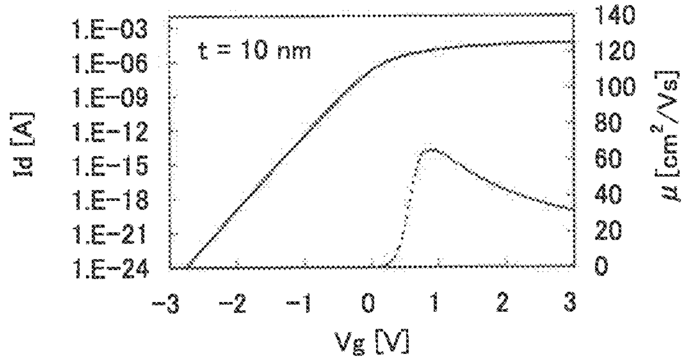
Figure 15:
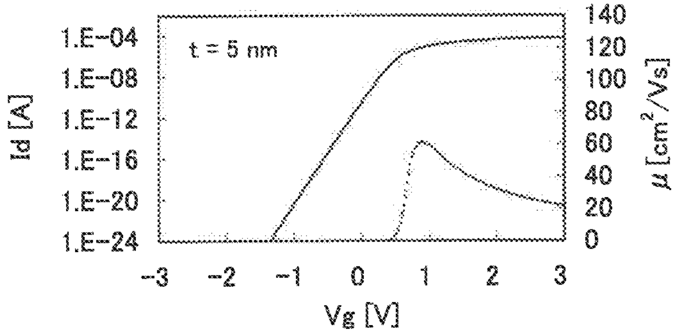

FIGS. 15A to 15C show the gate voltage $V_g$ dependence of the drain current $I_d$ (a solid line) and the mobility μ (a dotted line) of the transistor that has the structure in FIG. 13B and has an offset length ($L_{off}$) of 5 nm. Here, the drain current $I_d$ is calculated on the assumption the drain voltage is +1 V, and the field-effect mobility u is calculated on the assumption the drain voltage is +0.1 V. FIG. 15A shows the gate voltage dependence of the transistor including the gate insulating layer 654 with a thickness of 15 nm. FIG. 15B shows the gate voltage dependence of the transistor including the gate insulating layer 654 with a thickness of 10 nm. FIG. 15C shows the gate voltage dependence of the transistor including the gate insulating layer 654 with a thickness of 5 nm.

Figure 16:
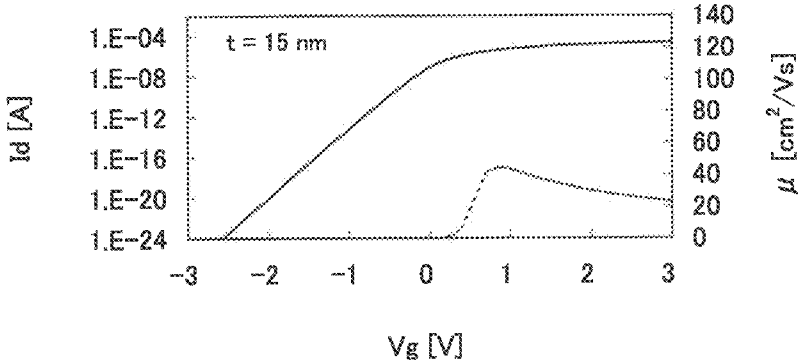
FIGS. 16A to 16C each show a calculation result of electrical characteristics of a semiconductor device.
Figure 16:
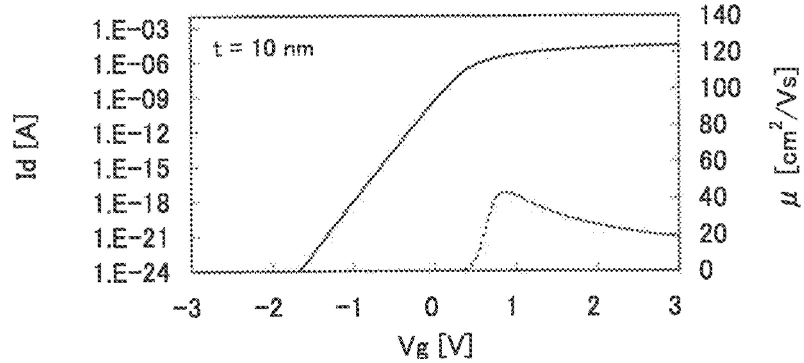
Figure 16:
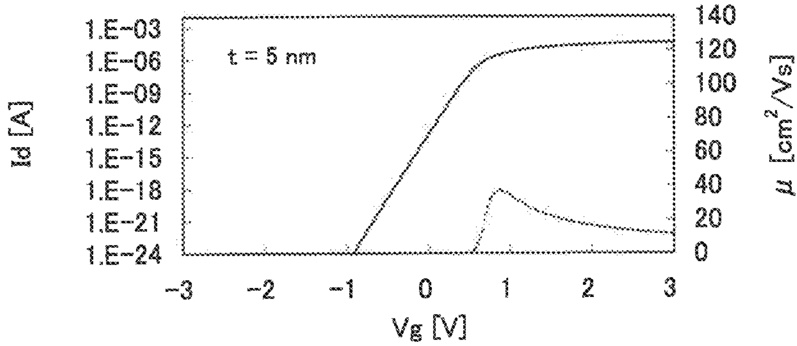

FIGS. 16A to 16C show the gate voltage dependence of the drain current $I_d$ (a solid line) and the mobility μ (a dotted line) of the transistor that has the structure in FIG. 13B and has an offset length ($L_{off}$) of 15 nm. Here, the drain current $I_d$ is calculated on the assumption the drain voltage is +1 V, and the mobility μ is calculated on the assumption the drain voltage is +0.1 V. FIG. 16A shows the gate voltage dependence of the transistor including the gate insulating layer 654 with a thickness of 15 nm. FIG. 16B shows the gate voltage dependence of the transistor including the gate insulating layer 654 with a thickness of 10 nm. FIG. 16C shows the gate voltage dependence of the transistor including the gate insulating layer 654 with a thickness of 5 nm.

As seen from FIGS. 14A to 14C, FIGS. 15A to 15C, and FIGS. 16A to 16C, as the gate insulating layer 654 is thinner in any of the structures, the off-state current of the transistor is significantly decreased, whereas no remarkable change occurs in the peak value of the mobility μ and the on-state current of the transistor.

The peak of the field-effect mobility μ is about 80 $cm^2/V \cdot s$ in FIGS. 14A to 14C, about 60 $cm^2/V \cdot s$ in FIGS. 15A to 15C, and about 40 $cm^2/V \cdot s$ in FIGS. 16A to 16C; thus, the peak of the mobility μ decreases as the offset length ($L_{off}$) is increased. The same applies to the off-state current of the transistor. The on-state current of the transistor also decreases as the offset length ($L_{off}$) is increased; however, the decrease in the on-state current is much more gradual than the decrease in the off-state current of the transistor. Further, the drain current exceeds 10 μA, which is needed for a storage circuit and the like, at a gate voltage around 1 V. Since the field-effect mobility of the transistor including an oxide semiconductor can be high as described above, the transistor can operate the storage circuit in any of the above embodiments without problems.

Next, as another example of the transistor, an example of a transistor that includes an oxide semiconductor layer containing In, Sn, and Zn as a channel formation layer will be described.

Figure 17A:
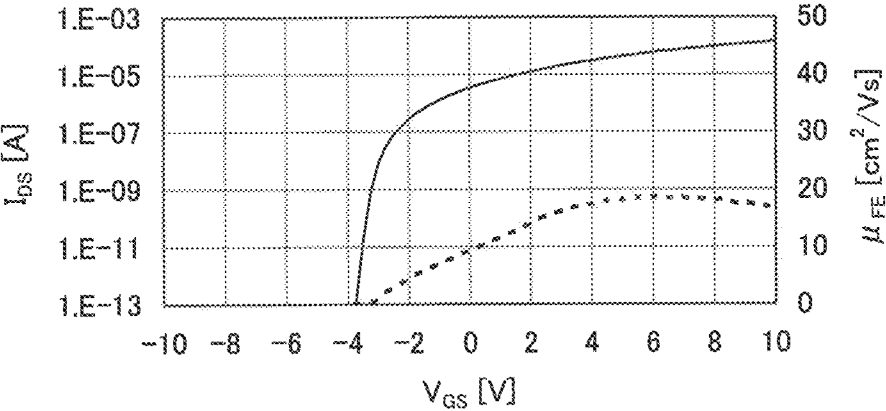
FIGS. 17A to 17C each show a measurement result of electrical characteristics of a semiconductor device.
Figure 17B:
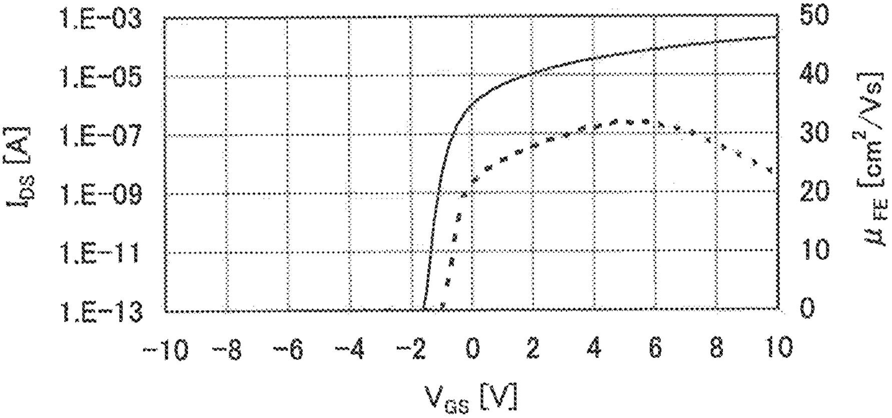
Figure 17C:
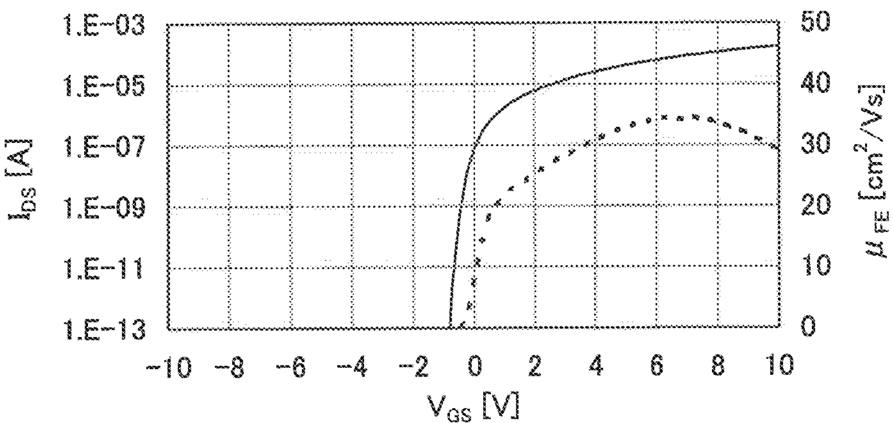

FIGS. 17A to 17C show characteristics of a transistor that includes an oxide semiconductor layer containing In, Sn, and Zn as its main components and a 100-nm-thick gate insulating layer, and has a channel length L of 3 μm and a channel width W of 10 μm. Note that $V_d$ is 10 V.

FIG. 17A shows characteristics of a transistor in which an oxide semiconductor layer is formed by deposition of an oxide semiconductor film containing In, Sn, and Zn as its main components by sputtering without heating an element formation layer intentionally. FIG. 17A shows that the field-effect mobility is 18.8 $cm^2/V \cdot s$. FIG. 17B shows characteristics of a transistor in which an oxide semiconductor layer is formed by deposition of an oxide semiconductor film containing In, Sn, and Zn as its main components by sputtering while a substrate is heated at 200° C. FIG. 17B shows that the field-effect mobility is 32.2 $cm^2/V \cdot s$. This means that intentional heating increases the field-effect mobility of the transistor.

FIG. 17C shows characteristics of a transistor in which an oxide semiconductor layer is formed by deposition of an oxide semiconductor film containing In, Sn, and Zn as its main components by sputtering at 200° C. and then subjected to heat treatment at 650° C. FIG. 17C shows that the field-effect mobility is 34.5 $cm^2/V \cdot s$. This means that heat treatment performed after the oxide semiconductor film is deposited increases the field-effect mobility.

Note that the oxide semiconductor layer containing In, Sn, and Zn as its main components may be crystallized in the following manner: oxygen ions are implanted into the oxide semiconductor layer, impurities such as hydrogen, water, a hydroxyl group, or hydride included in the oxide semiconductor are released by heat treatment, and the oxide semiconductor layer is crystallized through the heat treatment or by another heat treatment performed later. By such crystallization treatment or recrystallization treatment, a non-single-crystal oxide semiconductor layer with favorable crystallinity can be obtained.

As for the transistor including the oxide semiconductor layer that contains In, Sn, and Zn as its main components and is formed without heating the element formation layer intentionally, the threshold voltage tends to be negatively shifted as shown in FIG. 17A, for example. In contrast, as for the transistor including the oxide semiconductor layer that is formed while the element formation layer is intentionally heated, the threshold voltage is shifted so that the transistor can be close to a normally-off transistor as shown in FIG. 17B, for example. It is thus found that at least one of the heat treatment during the deposition of the oxide semiconductor film and the heat treatment after the deposition makes the transistor more likely to be normally off.

The threshold voltage of a transistor can also be controlled by changing the ratio of In, Sn, and Zn. For example, when the composition ratio of In, Sn, and Zn in the oxide semiconductor film is 2:1:3, the transistor is more likely to serve as a normally-off transistor.

For example, when a gate bias is applied with an intensity of 2 MV/cm at 150° C. for 1 hour to perform a bias-temperature stress test (BT test), the drift of the threshold voltage is less than ±1.5 V, preferably less than ±1.0 V. This means that the stability against gate-bias stress is enhanced by at least one of the heat treatment during the deposition of the oxide semiconductor film and the heat treatment after the deposition. FIGS. 18A and 18B and FIGS. 19A and 19B show the results of the BT test performed on the following two transistors: Sample 1 on which heat treatment is not performed after formation of an oxide semiconductor film, and Sample 2 on which heat treatment at 650° C. is performed after formation of an oxide semiconductor film. As the BT test, a positive BT test and a negative BT test were performed.

In the positive BT test, first, $V_{gs}$-$I_{ds}$ characteristics of the transistors were measured at a temperature of element formation layers (substrates) of 25° C. and $V_{ds}$ of 10 V. Then, the temperature of the element formation layers (substrates) was set to 150° C. and $V_{ds}$ was set to 0.1 V. After that, $V_{gs}$ of 20 V was applied so that the intensity of an electric field applied to gate insulating layers was 2 MV/cm, and the condition was kept for 1 hour. Next, $V_{gs}$ was set to 0 V. Then, $V_{gs}$-$I_{ds}$ characteristics of the transistors were measured at a temperature of the element formation layers (substrates) of 25° C. and Vas of 10 V.

In the negative BT test, first, $V_{gs}$-$I_{ds}$ characteristics of the transistors were measured at a temperature of the element formation layers (substrates) of 25° C. and $V_{ds}$ of 10 V. Then, the temperature of the element formation layers (substrates) was set to 150° C. and $V_{ds}$ was set to 0.1 V. After that, $V_{gs}$ of −20 V was applied so that the intensity of an electric field applied to the gate insulating layers was −2 MV/cm, and the condition was kept for 1 hour. Next, $V_{gs}$ was set to 0 V. Then, $V_{gs}$-$I_{ds}$ characteristics of the transistors were measured at a temperature of the element formation layers (substrates) of 25° C. and $V_{ds}$ of 10 V.

Figure 18A:
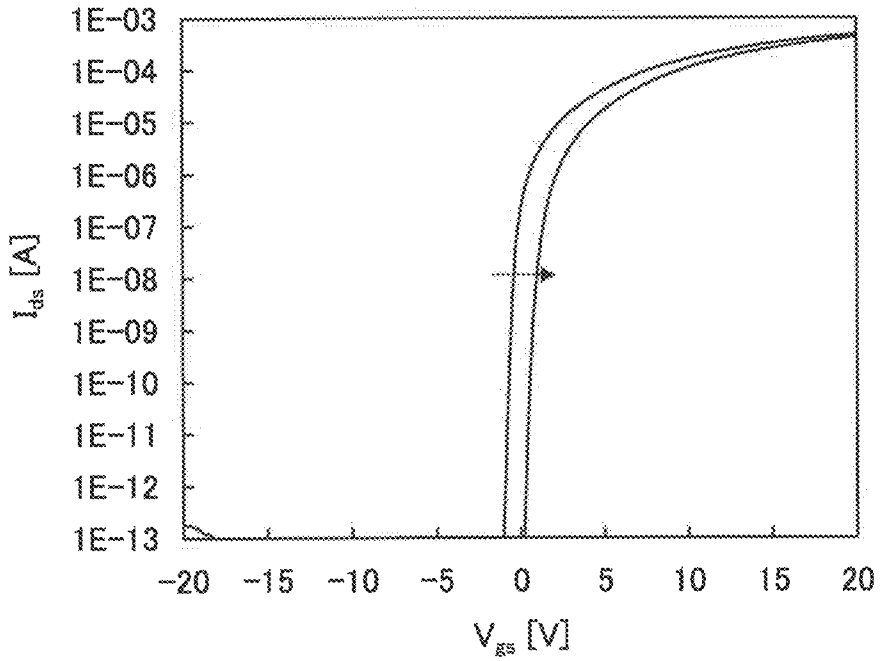
FIGS. 18A and 18B each show a measurement result of electrical characteristics of a semiconductor device.
Figure 18B:
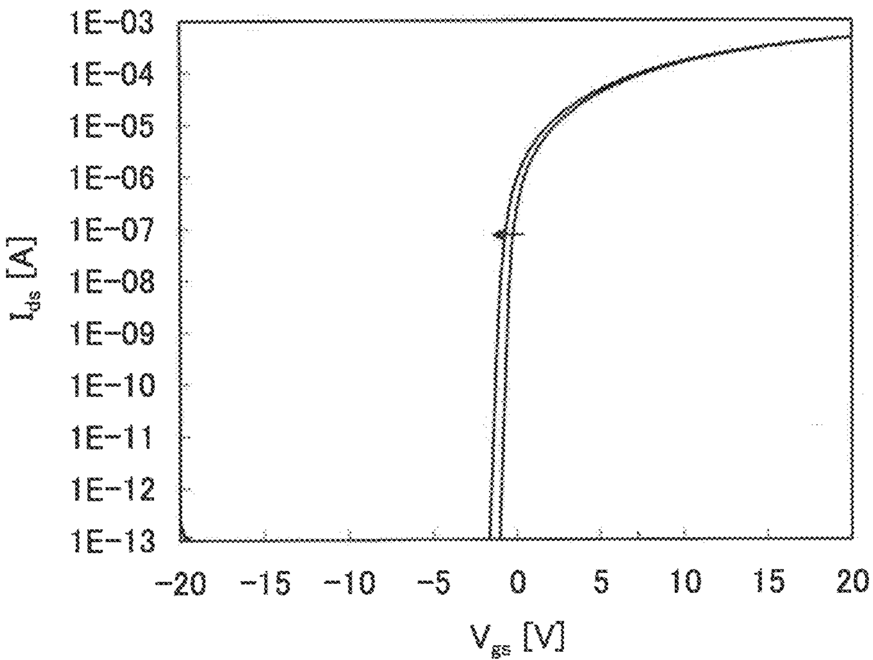
Figure 19A:
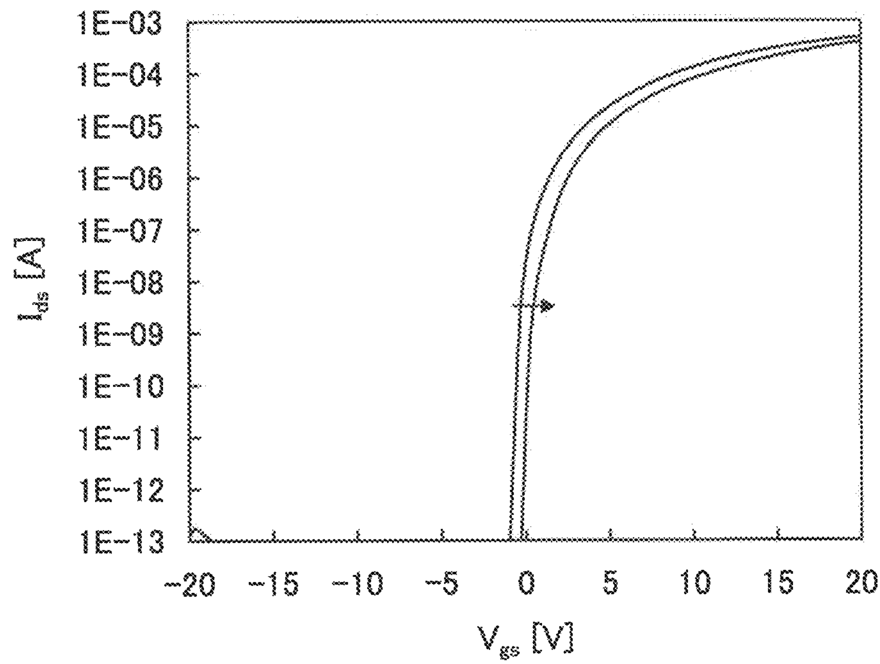
FIGS. 19A and 19B each show a measurement result of electrical characteristics of a semiconductor device.
Figure 19B:
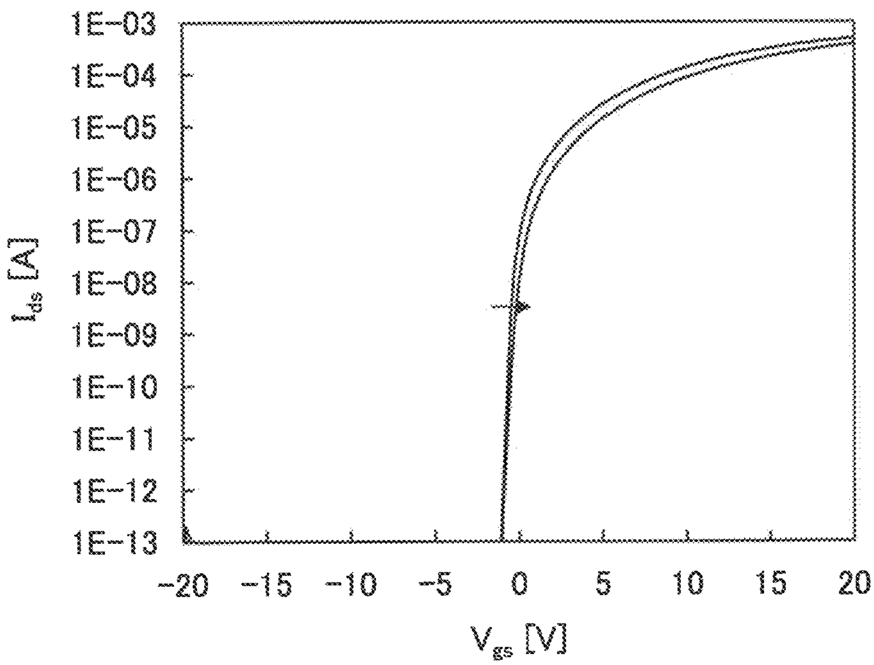

FIGS. 18A and 18B show the result of the positive BT test of Sample 1 and the result of the negative BT test of Sample 1, respectively. FIGS. 19A and 19B show the result of the positive BT test of Sample 2 and the result of the negative BT test of Sample 2, respectively.

As shown in FIGS. 18A and 18B, the amount of shift in the threshold voltage of Sample 1 due to the positive BT test and that due to the negative BT test were 1.80 V and −0.42 V, respectively. As shown in FIGS. 19A and 19B, the amount of shift in the threshold voltage of Sample 2 due to the positive BT test and that due to the negative BT test were 0.79 V and 0.76 V, respectively. It is therefore found that in both Sample 1 and Sample 2, the amount of shift in the threshold voltage of the transistor between before and after the BT tests is small and the reliability is high.

In addition, when an oxide semiconductor film that is formed by sputtering using a metal oxide target having a composition ratio of In:Sn:Zn=1:1:1 without heating an element formation layer intentionally is analyzed by X-ray diffraction (XRD), a halo pattern is observed. However, the oxide semiconductor film can be crystallized by being subjected to heat treatment. The temperature of the heat treatment at that time can be set as appropriate; when the heat treatment is performed at 650° C., for example, a clear diffraction peak can be observed by X-ray diffraction.

Here, the results of XRD analysis of an In—Sn—Zn—O film are shown below. The XRD analysis was conducted using an X-ray diffractometer D8 ADVANCE manufactured by Bruker AXS, and measurement was performed by an out-of-plane method.

Sample A and Sample B were prepared and the XRD analysis was performed thereon. A method for fabricating Sample A and Sample B will be described below. An In—Sn—Zn—O film with a thickness of 100 nm was formed over a quartz substrate that had been subjected to dehydrogenation treatment.

The In—Sn—Zn—O film was deposited with a sputtering apparatus with a power of 100 W (DC) in an oxygen atmosphere. As a target for the sputtering, an In—Sn-Zn-O target having an atomic ratio of In:Sn:Zn=1:1:1 was used. The heating temperature at the deposition was 200° C. A sample fabricated in the above step was Sample A.

Next, a sample fabricated by a method similar to that of Sample A was subjected to heat treatment at 650° C. Here, heat treatment in a nitrogen atmosphere was performed for 1 hour and then, heat treatment in an oxygen atmosphere was performed for 1 hour without lowering the temperature. A sample fabricated in the above steps was Sample B.

Figure 20:
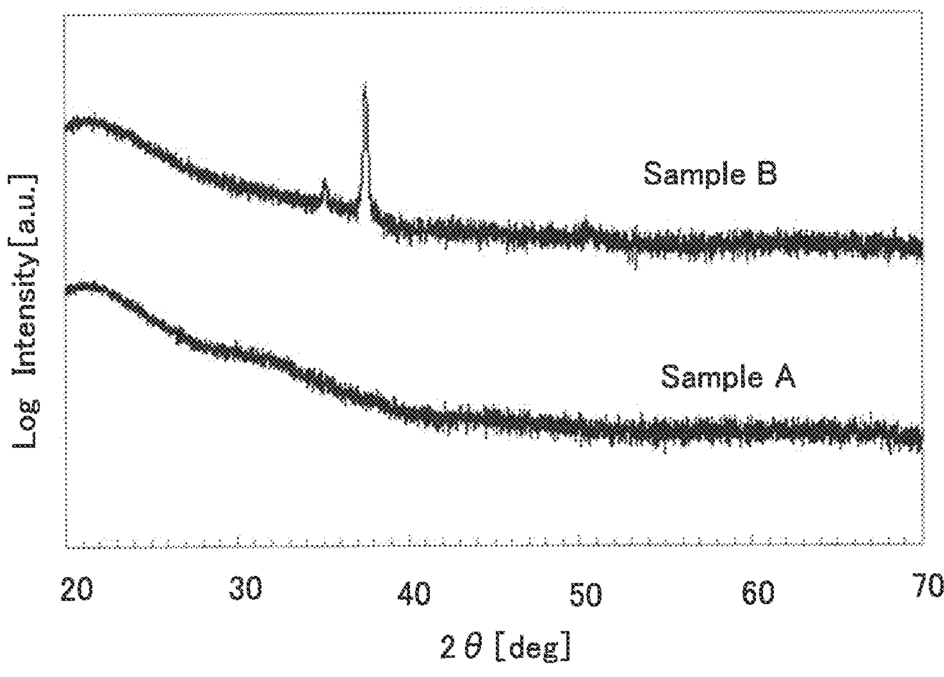
FIG. 20 shows XRD measurement results of oxide semiconductor films of semiconductor devices.

FIG. 20 shows XRD spectra of Sample A and Sample B. No peak derived from a crystal was observed in Sample A, whereas peaks derived from a crystal were observed when 2θ was around 35 deg. and at 37 deg. to 38 deg. in Sample B. This means that the crystallinity of the oxide semiconductor layer is increased by at least one of the heat treatment during the deposition of the oxide semiconductor film containing In, Sn, and Zn as its main components and the heat treatment after the deposition.

Figure 21:
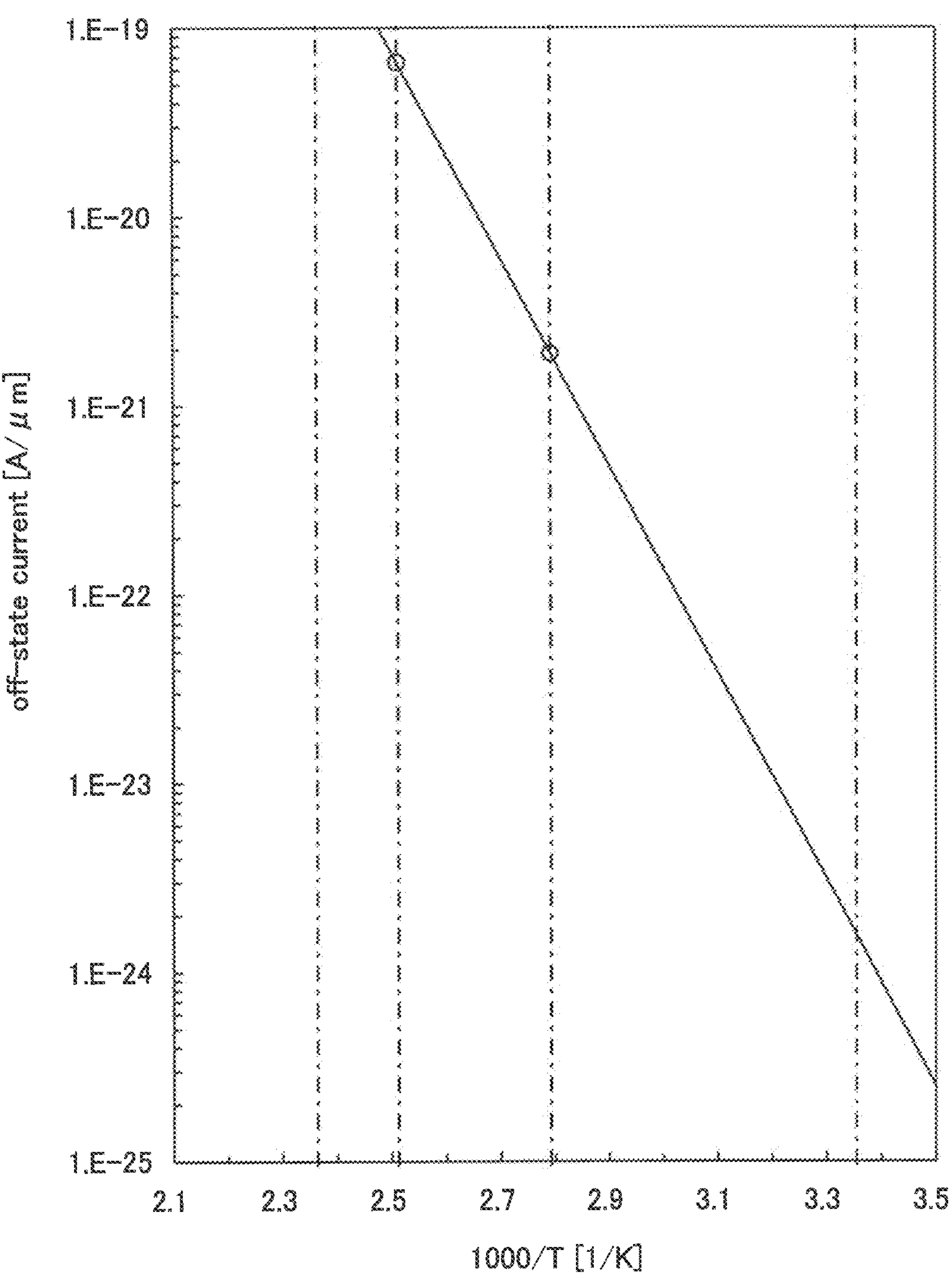
FIG. 21 shows characteristics of a semiconductor device.

By performing at least one of the heat treatment during the deposition of the oxide semiconductor film and the heat treatment after the deposition, the off-state current of the fabricated transistor per micrometer of channel width is 1 aA ($1\times10^{-18}$ A) or lower, 100 zA ($1\times10^{-19}$ A) or lower, and 1 zA ($1\times10^{-21}$ A) or lower when the temperature of the element formation layer (substrate) is 125° C., 85° C., and room temperature (27° C.), respectively, as shown in FIG. 21, for example. Moreover, the off-state current of the above transistor per micrometer of channel width can be preferably 0.1 aA ($1\times10^{-19}$ A) or lower, 10 zA ($1\times10^{-20}$ A) or lower, and 0.1 zA ($1\times10^{-22}$ A) or lower at 125° C., 85° C., and room temperature (27° C.), respectively.

Although hydrogen can be removed from an oxide semiconductor film containing In, Sn, and Zn as its main components by heat treatment, a film that does not contain impurities inherently is preferably formed because moisture is released from the oxide semiconductor film at a higher temperature than from an oxide semiconductor containing In, Ga, and Zn as its main components.

In addition, the relation between the temperature of the element formation layer (substrate) and electrical characteristics of Sample B, on which heat treatment at 650° C. was performed after formation of the oxide semiconductor film, was evaluated.

The transistor used for the measurement has a channel length L of 3 μm, a channel width W of 10 μm, $L_{ov}$ of 3 μm on one side (total $_{of}$6 μm), and dW of 0 μm. Note that Vas was 10 V. The measurement was performed under the following six conditions: the temperatures of the element formation layer (substrate) were −40° C., −25° C., 25° C., 75° C., 125° C., and 150° C. Note that $L_{ov}$ represents the width of a portion where a gate electrode overlaps with one of a pair of electrodes, and dW represents the width of a portion of the pair of electrodes which does not overlap with an oxide semiconductor film.

Figure 22:
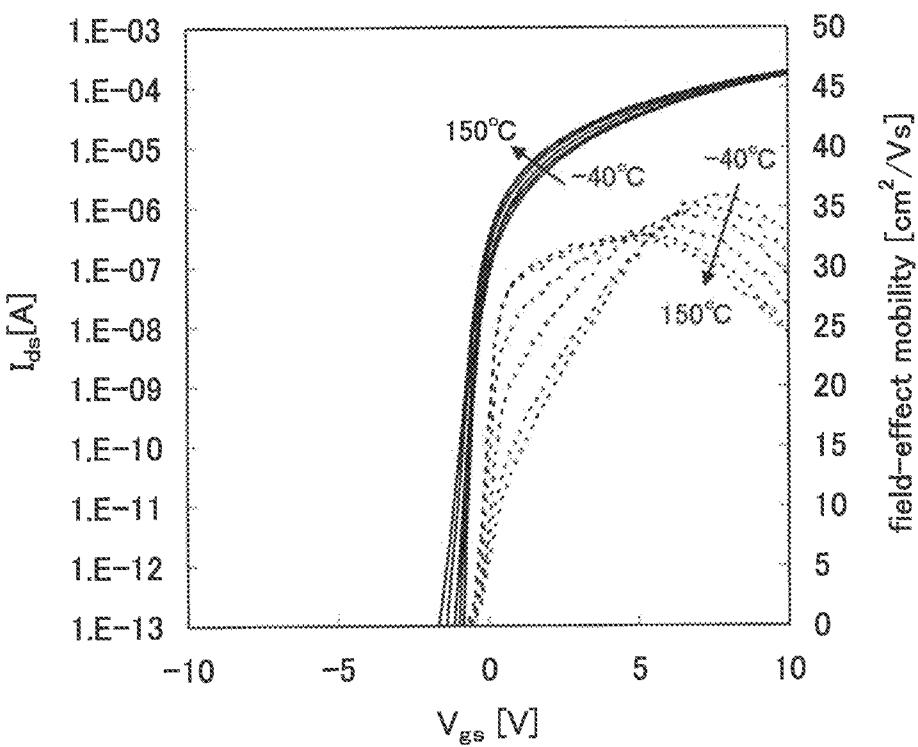
FIG. 22 shows characteristics of a semiconductor device.
Figure 23A:
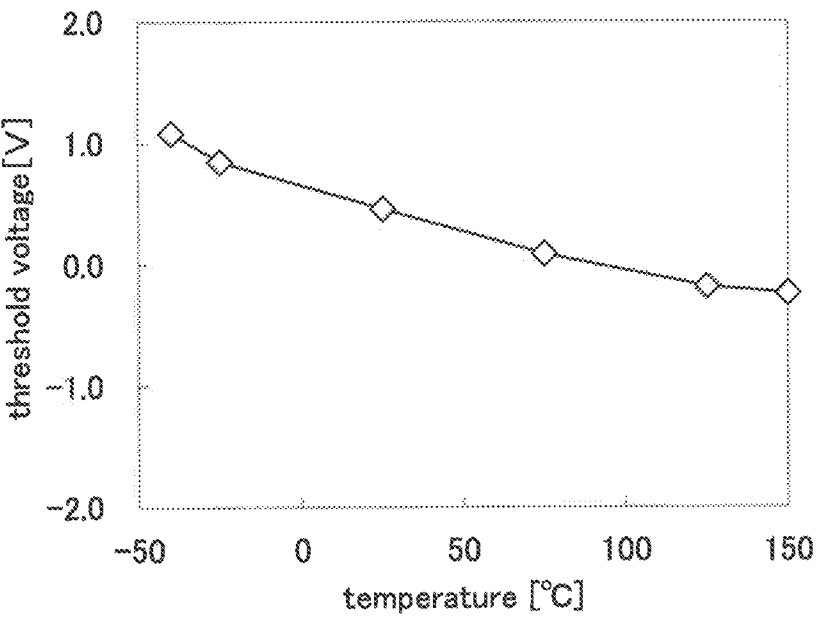
FIGS. 23A and 23B each show characteristics of a semiconductor device.
Figure 23B:
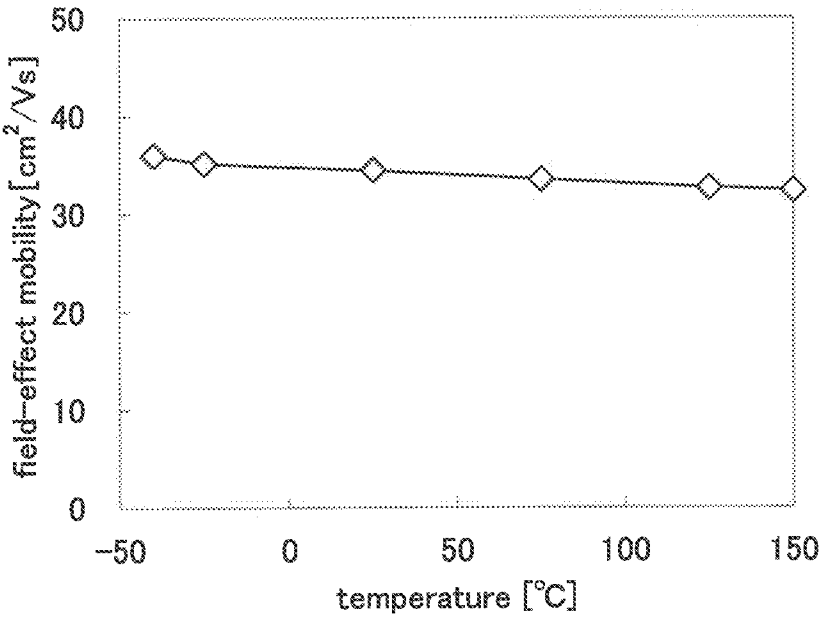

FIG. 22 shows the $V_{gs}$ dependence of $I_{ds}$ (a solid line) and the field-effect mobility (a dotted line). FIG. 23A shows the relation between the threshold voltage and the temperature of the element formation layer (substrate). FIG. 23B shows the relation between the field-effect mobility and the temperature of the element formation layer (substrate).

From FIG. 22 and FIG. 23A, it is found that the threshold voltage gets lower as the temperature of the element formation layer (substrate) increases. Note that the threshold voltage is decreased from 1.09 V to −0.23 V in the range from −40° C. to 150° C.

From FIG. 22 and FIG. 23B, it is found that the field-effect mobility gets lower as the temperature of the element formation layer (substrate) increases. Note that the field-effect mobility is decreased from 36 cm2/V·s to 32 cm2/V·s in the range from −40° C. to 150° C. Thus, it is found that variation in electrical characteristics is small in the above temperature range. The above is the description of the transistors including the oxide semiconductor layer containing In, Sn, and Zn.

In the transistor including the oxide semiconductor layer containing In, Sn, and Zn as its main components, the field-effect mobility can be 30 $cm^2$/V·s or higher, preferably 40 $cm^2$/V·s or higher, further preferably 60 $cm^2$/V·s or higher with the off-state current maintained at 1 aA/μm or lower, and can have on-state current high enough to meet the specifications demanded for LSIs. For example, in a transistor with a channel width of 40 nm and a channel length of 33 nm, an on-state current of 12 μA or higher can flow when the gate voltage is 2.7 V and the drain voltage is 1.0 V. Moreover, the transistor can have favorable electrical characteristics in the operating temperature range of transistors. Since the transistor including the oxide semiconductor layer has such characteristics, even when the transistor including the oxide semiconductor layer is included in a circuit constituted by transistors including semiconductor layers containing a semiconductor of Group 14 (e.g., silicon), a circuit having a novel function can be provided without sacrificing the operation speed.

This embodiment can be implemented in combination with any of the other embodiments as appropriate.

Embodiment 7

In this embodiment, an arithmetic processing unit such as a CPU will be described as an example of a semiconductor device.

Figure 24:
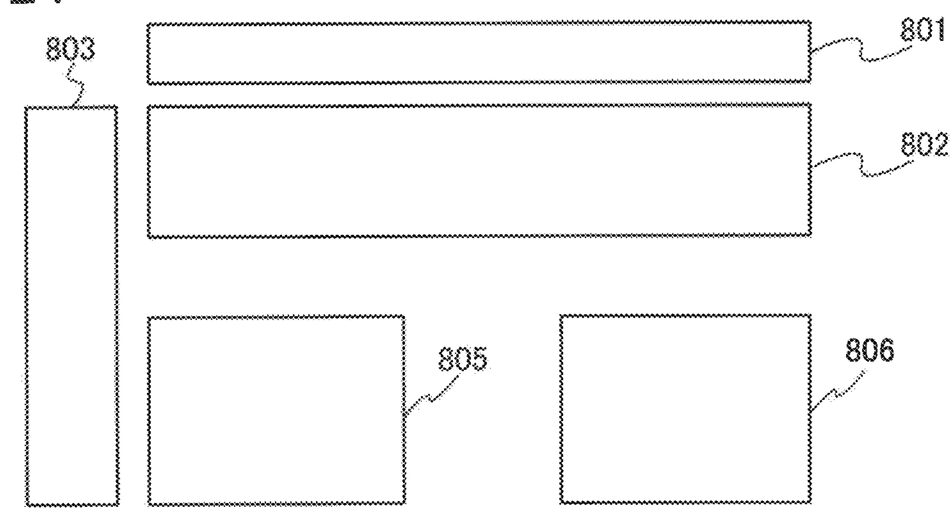
FIG. 24 illustrates an example of an arithmetic processing unit.

FIG. 24 illustrates an example of an arithmetic processing unit. The arithmetic processing unit in FIG. 24 includes a bus interface (IF) 801, a control unit (CTL) 802, a cache memory (CACHE) 803, an instruction decoder (IDecoder) 805, and a processing circuit 806.

The bus interface 801 has a function of exchanging signals with an external unit and a function of exchanging signals with circuits in the arithmetic processing unit.

The control unit 802 has a function of controlling operations of the circuits in the arithmetic processing unit.

The cache memory 803 is controlled by the control unit 802 and has a function of temporary retaining data used while the arithmetic processing unit operates. For example, a plurality of cache memories 803 may be provided as a level-1 cache and a level-2 cache in the arithmetic processing unit.

The instruction decoder 805 has a function of translating an instruction signal which is read. The translated instruction signal is input to the control unit 802, and the control unit 802 outputs a control signal corresponding to the instruction signal to the processing circuit 806.

The processing circuit 806 is controlled by the control unit 802 and has a function of performing arithmetic processing in accordance with the inputted instruction signal. The processing circuit 806 includes an ALU or the like, and the logic circuit unit 101 and the storage circuit 103 illustrated in FIGS. 1A to 1C, FIGS. 2A and 2B, FIG. 3, FIGS. 4A and 4B, FIGS. 5A to 5C, and FIGS. 6A and 6B can be provided in the processing circuit 806.

Note that a register or the like may be provided as a memory in the arithmetic processing unit. In that case, the memory is controlled by the control unit 802. For example, a plurality of memories may be provided in the arithmetic processing unit, and some memories may be used as memories for the processing circuit 806 and other memories may be used as registers for the instruction decoder 805.

Further, the storage circuit 103 illustrated in FIGS. 1A to 1C, FIGS. 2A and 2B, FIG. 3, FIGS. 4A and 4B, FIGS. 5A to 5C, and FIGS. 6A and 6B may be provided in the control unit 802 or the instruction decoder 805. In that case, data input to a transistor in an integrated circuit can be stored in the storage circuit in the control unit 802 or the instruction decoder 805, thereby achieving data retention, high-speed operation, and reduction in power consumption.

This embodiment can be implemented in combination with any of the other embodiments as appropriate.

Embodiment 8

In this embodiment, examples of an electronic device including the arithmetic processing unit in Embodiment 7 will be described.

Examples of the electronic devices in this embodiment will be described with reference to FIGS. 25A to 25D.

Figure 25A:
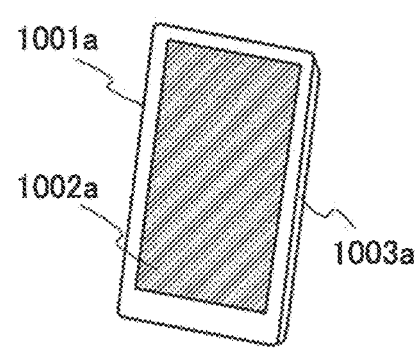
FIGS. 25A to 25D each illustrate an example of an electronic device.

The electronic device illustrated in FIG. 25A is an example of a personal digital assistant. The personal digital assistant illustrated in FIG. 25A includes a housing 1001*a* and a display portion 1002*a* provided in the housing 1001*a*.

Note that a side surface 1003*a* of the housing 1001*a* may be provided with a connection terminal for connecting the personal digital assistant to an external device and/or a button used to operate the personal digital assistant in FIG. 25A.

The housing 1001*a* in the personal digital assistant in FIG. 25A includes a CPU, a memory, an interface for transmitting and receiving signals between the external device and each of the CPU and the memory, and an antenna for transmitting and receiving signals to and from the external device.

The personal digital assistant in FIG. 25A serves as one or more devices selected from a telephone, an e-book reader, a personal computer, and a game machine, for example.

Figure 25C:
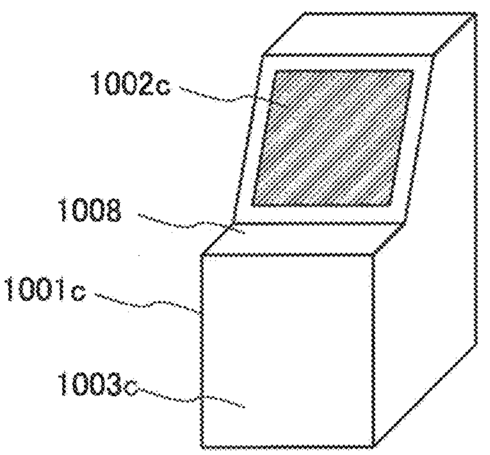
Figure 25B:
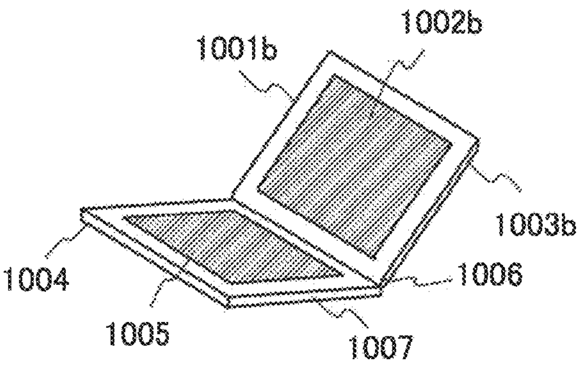

The electronic device illustrated in FIG. 25B is an example of a foldable personal digital assistant. The personal digital assistant in FIG. 25B includes a housing 1001*b*, a display portion 1002*b* provided in the housing 1001*b*, a housing 1004, a display portion 1005 provided in the housing 1004, and a hinge 1006 for connecting the housing 1001*b* and the housing 1004.

In the personal digital assistant in FIG. 25B, the housing 1001*b* can be stacked on the housing 1004 by moving the housing 1001*b* or the housing 1004 with the hinge 1006.

Note that a side surface 1003*b* of the housing 1001*b* or a side surface 1007 of the housing 1004 may be provided with a connection terminal for connecting the personal digital assistant to an external device and/or a button for operating the personal digital assistant in FIG. 25B.

The display portion 1002*b* and the display portion 1005 may display different images or one image. Note that the display portion 1005 is not necessarily provided, and a keyboard which is an input device may be provided instead of the display portion 1005.

The housing 1001*b* or the housing 1004 in the personal digital assistant in FIG. 25B includes a CPU, a memory, and an interface for transmitting and receiving signals between the external device and each of the CPU and the memory. Note that the personal digital assistant in FIG. 25B may include an antenna for transmitting and receiving signals to and from the external device.

The personal digital assistant in FIG. 25B serves as one or more of a telephone, an e-book reader, a personal computer, and a game machine, for example.

The electronic device illustrated in FIG. 25C is an example of a stationary information terminal. The stationary information terminal in FIG. 25C includes a housing 1001*c* and a display portion 1002*c* provided in the housing 1001*c*.

Note that the display portion 1002*c* can be provided on a top board 1008 of the housing 1001*c*.

The housing 1001*c* of the stationary information terminal in FIG. 25C includes a CPU, a memory, and an interface for transmitting and receiving signals between the external device and each of the CPU and the memory. Note that the stationary information terminal in FIG. 25C may include an antenna for transmitting and receiving signals to and from the external device.

Further, a side surface 1003*c* of the housing 1001*c* in the stationary information terminal in FIG. 25C may be provided with one or more parts selected from a ticket ejection portion that ejects a ticket or the like, a coin slot, and a bill slot.

The stationary information terminal in FIG. 25C serves as an automated teller machine, a data communication terminal for ticketing or the like (also referred to as multi-media station), or a game machine, for example.

Figure 25D:
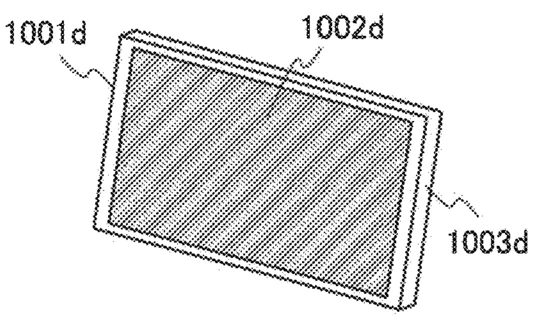

FIG. 25D illustrates an example of a stationary information terminal. The stationary information terminal in FIG. 25D includes a housing 1001*d* and a display portion 1002*d* provided in the housing 1001*d*. Note that a support for supporting the housing 1001*d* may also be provided.

Note that a side surface 1003*d* of the housing 1001*d* may be provided with a connection terminal for connecting the stationary information terminal to an external device and/or a button for operating the stationary information terminal in FIG. 25D.

The housing 1001_d_ of the stationary information terminal in FIG. 25D may include a CPU, a memory, and an interface for transmitting and receiving signals between the external device and each of the CPU and the memory. Moreover, the stationary information terminal in FIG. 25D may include an antenna for transmitting and receiving signals to and from the external device.

The stationary information terminal in FIG. 25D serves as a digital photo frame, a monitor, or a television device, for example.

The arithmetic processing unit in Embodiment 7 is used as the CPU in the electronic devices illustrated in FIGS. 25A to 25D.

As described with reference to FIGS. 25A to 25D, the examples of the electronic devices in this embodiment each include the arithmetic processing unit in Embodiment 7 as the CPU.

By using the storage circuit and the logic circuit in any of the above embodiments, the examples of the electronic devices in this embodiment can retain data for a long time while power consumed by the arithmetic processing unit is reduced. In addition, the use of the storage circuit and the logic circuit in any of the above embodiments can reduce the area of the arithmetic processing unit.

This embodiment can be implemented in combination with any of the other embodiments as appropriate.

This application is based on Japanese Patent Applications Serial No. 2011-113057 filed with Japan Patent Office on May 20, 2011, the entire contents of which are hereby incorporated by reference.

What is claimed is:

1. A semiconductor device comprising:

a first transistor;

a second transistor;

a third transistor;

a fourth transistor;

a first capacitor;

a second capacitor; and an inverter, wherein one of a source and a drain of the first transistor is electrically connected to a first terminal of the inverter, wherein the other of the source and the drain of the first transistor is electrically connected to a first electrode of the first capacitor and a gate of the third transistor, wherein a gate of the first transistor is electrically connected to a gate of the second transistor, wherein one of a source and a drain of the second transistor is electrically connected to a second terminal of the inverter, wherein the other of the source and the drain of the second transistor is electrically connected to a first electrode of the second capacitor and a gate of the fourth transistor, wherein one of a source and a drain of the third transistor is electrically connected to one of a source and a drain of the fourth transistor, wherein the other of the source and the drain of the third transistor is electrically connected to the other of the source and the drain of the fourth transistor, wherein a polarity of the third transistor is different from a polarity of the fourth transistor, wherein the first transistor comprises a first oxide semiconductor layer including a channel formation region, and wherein the third transistor comprises a crystalline silicon layer including a channel formation region.

2. The semiconductor device according to claim 1, wherein the first oxide semiconductor layer comprises In, Ga, and Zn.

3. The semiconductor device according to claim 1, wherein the first oxide semiconductor layer comprises In.

4. The semiconductor device according to claim 1, wherein the second transistor comprises a second oxide semiconductor layer including a channel formation region.

5. The semiconductor device according to claim 4, wherein the second oxide semiconductor layer comprises In, Ga, and Zn.

6. The semiconductor device according to claim 4, wherein the second oxide semiconductor layer comprises In.

7. A semiconductor device comprising:

a first transistor;

a second transistor;

a third transistor;

a fourth transistor;

a first capacitor;

a second capacitor; and an inverter, wherein one of a source and a drain of the first transistor is electrically connected to a first terminal of the inverter, wherein the other of the source and the drain of the first transistor is electrically connected to a first electrode of the first capacitor and a gate of the third transistor, wherein a gate of the first transistor is electrically connected to a gate of the second transistor, wherein one of a source and a drain of the second transistor is electrically connected to a second terminal of the inverter, wherein the other of the source and the drain of the second transistor is electrically connected to a first electrode of the second capacitor and a gate of the fourth transistor, wherein one of a source and a drain of the third transistor is electrically connected to one of a source and a drain of the fourth transistor, wherein the other of the source and the drain of the third transistor is electrically connected to the other of the source and the drain of the fourth transistor, wherein a polarity of the third transistor is different from a polarity of the fourth transistor, wherein the first transistor comprises a first oxide semiconductor layer including a channel formation region, wherein the third transistor comprises a crystalline silicon layer including a channel formation region, and wherein the first oxide semiconductor layer is located over the crystalline silicon layer with an insulating layer provided therebetween.

8. The semiconductor device according to claim 7, wherein the first oxide semiconductor layer comprises In, Ga, and Zn.

9. The semiconductor device according to claim 7, wherein the first oxide semiconductor layer comprises In.

10. The semiconductor device according to claim 7, wherein the second transistor comprises a second oxide semiconductor layer including a channel formation region.

11. The semiconductor device according to claim 10, wherein the second oxide semiconductor layer comprises In, Ga, and Zn.

12. The semiconductor device according to claim 10, wherein the second oxide semiconductor layer comprises In.

* * * * *